United States Patent
Roesner et al.

(10) Patent No.: US 7,236,918 B2
(45) Date of Patent: Jun. 26, 2007

(54) METHOD AND SYSTEM FOR SELECTIVE COMPILATION OF INSTRUMENTATION ENTITIES INTO A SIMULATION MODEL OF A DIGITAL DESIGN

(75) Inventors: Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 10/749,607

(22) Filed: Dec. 31, 2003

(65) Prior Publication Data

US 2005/0149313 A1 Jul. 7, 2005

(51) Int. Cl.
*G06F 17/50* (2006.01)

(52) U.S. Cl. .......................... 703/14; 717/143; 703/22; 703/13; 703/17; 716/18

(58) Field of Classification Search .................. 703/14, 703/17, 13, 22; 717/143; 709/328; 716/18, 716/11, 8, 6; 710/200; 707/1
See application file for complete search history.

(56) References Cited

U.S. PATENT DOCUMENTS

| | | | |
|---|---|---|---|
| 5,212,650 A | 5/1993 | Hooper et al. | |
| 5,369,763 A | 11/1994 | Biles | |
| 5,604,895 A | 2/1997 | Raimi | |
| 6,117,181 A | 9/2000 | Dearth et al. | |
| 6,195,627 B1 | 2/2001 | Bargh et al. | |
| 6,195,629 B1 | 2/2001 | Bargh et al. | |
| 6,202,042 B1 | 3/2001 | Bargh et al. | |
| 6,285,914 B1 | 9/2001 | Bae et al. | |
| 6,345,242 B1 | 2/2002 | Dearth et al. | |
| 6,393,426 B1 | 5/2002 | Odom et al. | |
| 6,519,612 B1 | 2/2003 | Howard et al. | |
| 6,546,532 B1 | 4/2003 | Kerzman et al. | |
| 6,581,191 B1 | 6/2003 | Schubert et al. | |
| 6,618,839 B1 | 9/2003 | Beardslee et al. | |
| 6,668,364 B2 | 12/2003 | McElvain et al. | |
| 6,687,710 B1 | 2/2004 | Dey | |
| 6,720,565 B2 | 4/2004 | Innes et al. | |
| 6,751,583 B1 | 6/2004 | Clarke et al. | |
| 6,754,763 B2 | 6/2004 | Lin | |
| 2001/0011212 A1* | 8/2001 | Raynaud et al. ............... 703/22 |
| 2002/0019969 A1 | 2/2002 | Hellestrand et al. | |
| 2002/0023252 A1* | 2/2002 | Lee et al. ....................... 716/6 |

(Continued)

*Primary Examiner*—Paul Rodriguez
*Assistant Examiner*—Kandasamy Thangavelu
(74) *Attorney, Agent, or Firm*—Diana R. Gerhardt; Dillon & Yudell LLP

(57) ABSTRACT

In a method of compiling a simulation model of a digital design, a compiler receives an indication of a desired set of instrumentation entities to be included within a simulation model of a digital design described by a plurality of hierarchically arranged design entities. The instrumentation entities monitor logical operation of one or more of the plurality of design entities during simulation for occurrence of events of interest. In response to the indication, the compiler determines by reference to a bill-of-materials of a previously compiled file whether or not the previously compiled file was compiled with instrumentation entities compatible with the desired set of instrumentation entities. In response to determining that the previously compiled file was compiled with compatible instrumentation entities, the compiler compiles the simulation model of the digital design utilizing the previously compiled file in accordance with the indication.

18 Claims, 17 Drawing Sheets

U.S. PATENT DOCUMENTS

| | | |
|---|---|---|
| 2002/0032559 A1 | 3/2002 | Hellestrand et al. |
| 2002/0049576 A1 | 4/2002 | Meyer |
| 2002/0120922 A1* | 8/2002 | Williams et al. ............ 717/143 |
| 2002/0123874 A1 | 9/2002 | Roesner et al. |
| 2002/0128809 A1* | 9/2002 | Roesner et al. ............... 703/17 |
| 2002/0129333 A1 | 9/2002 | Chandhoke et al. |
| 2002/0152060 A1 | 10/2002 | Tseng |
| 2003/0005416 A1 | 1/2003 | Henftling et al. |
| 2003/0035375 A1 | 2/2003 | Freeman |
| 2003/0037222 A1 | 2/2003 | Emberson et al. |
| 2003/0101039 A1 | 5/2003 | Gabele et al. |
| 2003/0121011 A1 | 6/2003 | Carter et al. |
| 2003/0135354 A1* | 7/2003 | Gabele et al. ................ 703/13 |
| 2003/0144828 A1 | 7/2003 | Lin |
| 2003/0188299 A1 | 10/2003 | Broughton et al. |
| 2003/0191621 A1* | 10/2003 | Gabele et al. ................ 703/17 |
| 2003/0191869 A1* | 10/2003 | Williams et al. ............ 709/328 |
| 2003/0192032 A1 | 10/2003 | Andrade et al. |
| 2003/0237078 A1* | 12/2003 | Williams et al. ............ 717/155 |
| 2004/0078767 A1* | 4/2004 | Burks et al. .................... 716/8 |
| 2004/0162805 A1* | 8/2004 | Wozniak ........................ 707/1 |
| 2004/0216075 A1* | 10/2004 | Nelson et al. ................. 716/18 |
| 2004/0216079 A1* | 10/2004 | Hunt et al. .................... 716/18 |
| 2004/0216080 A1* | 10/2004 | Roesner et al. ................ 716/18 |
| 2004/0267996 A1* | 12/2004 | Hammarlund et al. ...... 710/200 |
| 2005/0049740 A1* | 3/2005 | Roesner et al. ............. 700/121 |
| 2005/0049842 A1* | 3/2005 | Roesner et al. ............... 703/14 |
| 2005/0050509 A1* | 3/2005 | Fields et al. .................. 716/18 |
| 2005/0102125 A1 | 5/2005 | Tseng |
| 2005/0102645 A1* | 5/2005 | Saunders et al. ............. 716/11 |
| 2005/0125754 A1 | 6/2005 | Schubert et al. |
| 2005/0137840 A1 | 6/2005 | Peck et al. |
| 2005/0149309 A1* | 7/2005 | Nelson et al. ................ 703/14 |
| 2005/0149313 A1* | 7/2005 | Roesner et al. ............... 703/22 |

* cited by examiner

```
ENTITY FXUCHK IS

PORT( S_IN      :   IN std_ulogic;
          Q_IN      :   IN std_ulogic;
          R_IN      :   IN std_ulogic;
          clock     :   IN std_ulogic;
          fails     :   OUT std_ulogic_vector(0 to 1);
          counts    :   OUT std_ulogic_vector(0 to 2);
          harvests  :   OUT std_ulogic_vector(0 to 1);
    );
```

452 { --!! BEGIN
     --!! Design Entity: FXU;

453 {
--!! Inputs
--!! S_IN    => B.C.S;
--!! Q_IN    => A.Q;
--!! R_IN    => R;
--!! CLOCK   => clock;
--!! End Inputs 454 {
--!! Fail Outputs;
--!! 0 : "Fail message for failure event 0";
--!! 1 : "Fail message for failure event 1";
--!! End Fail Outputs;

455 {
--!! Count Outputs;
--!! 0 : <event0> clock;
--!! 1 : <event1> clock;
--!! 2 : <event2> clock;
--!! End Count Outputs;

456 {
--!! Harvest Outputs;
--!! 0 : "Message for harvest event 0";
--!! 1 : "Message for harvest event 1";
--!! End Harvest Outputs;

457 { --!! End;

```
ARCHITECTURE example of FXUCHK IS

BEGIN

... HDL code for entity body section ...    458

END;
```

450 encompasses the ENTITY/PORT declaration.
451 encompasses sections 452–457.
440 encompasses the whole block including 458.

| ENTITY | SELECTED IEs |
|---|---|
| A | |
| B | |
| C | |
| D | |
| E | {IE3} |
| F | {IE5} |
| G | {IE6}, {IE7} |
| H | |
| I | |
| J | |
| K | |
| L | |
| M | |

| ENTITY | DESCENDANTS |
|---|---|
| A | B, C, D |
| B | E, H, {IE1}, {IE2} |
| C | I |
| D | K, E |
| E | F, G, {IE3} |
| F | {IE5} |
| G | {IE6}, {IE7} |
| H | {IE4} |
| I | J |
| J | |
| K | L, M, {IE8} |
| L | {IE9} |
| M | {IE10} |

*Fig. 6B*

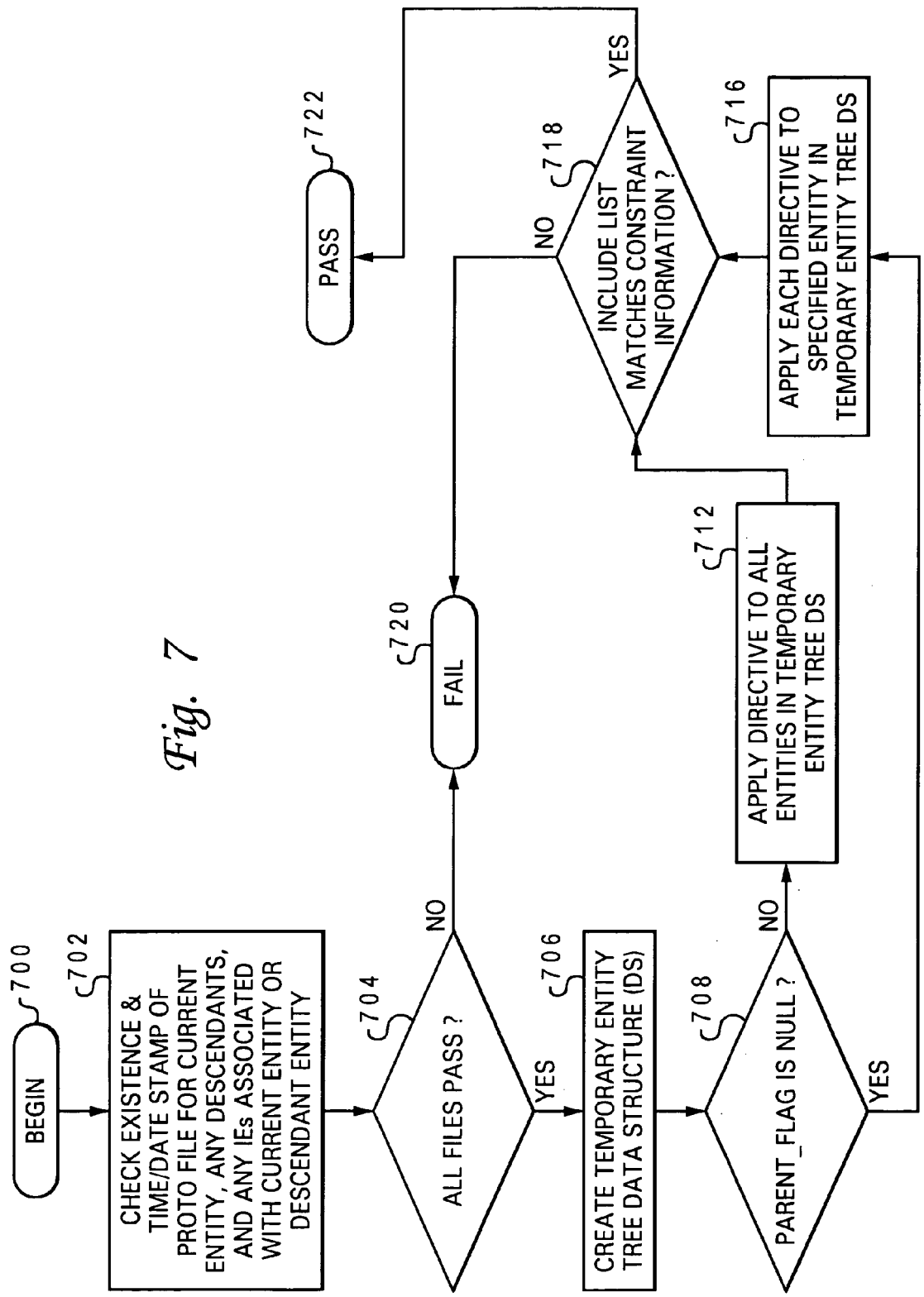

METHOD AND SYSTEM FOR SELECTIVE COMPILATION OF INSTRUMENTATION ENTITIES INTO A SIMULATION MODEL OF A DIGITAL DESIGN

This application is related to U.S. patent application Ser. No. 10/116,524, which is assigned to the assignee of the present application and incorporated herein by reference in its entirety.

BACKGROUND OF THE INVENTION

1. Technical Field

The present invention relates in general to designing and simulating digital devices, modules and systems in a distributed simulation environment. In particular, the present invention relates to a method and system that improve a distributed simulation environment by permitting a user to selectively compile instrumentation entities into a simulation model.

2. Description of the Related Art

In a typical digital design process, verifying the logical correctness of a digital design and debugging the design (if necessary) are important steps of the design process performed prior to developing a circuit layout. Although it is certainly possible to test a digital design by actually building the digital design, digital designs, particularly those implemented by integrated circuitry, are typically verified and debugged by simulating the digital design on a computer, due in part to the time and expense required for integrated circuit fabrication.

In a typical automated design process, a circuit designer enters into an electronic computer-aided design (ECAD) system a high-level description of the digital design to be simulated utilizing a hardware description language (HDL), such as VHDL, thus producing a digital representation of the various circuit blocks and their interconnections. In the digital representation, the overall circuit design is frequently divided into smaller parts, hereinafter referred to as design entities, which are individually designed, often by different designers, and then combined in a hierarchical manner to create an overall model. This hierarchical design technique is very useful in managing the enormous complexity of the overall design and facilitates error detection during simulation. After initial development of the digital representation of the design has been accomplished, the ECAD system compiles the digital representation of the design into a simulation model having a format best suited for simulation.

A simulator then exercises the simulation model to detect logical errors in the digital design. A simulator is typically a software tool that operates on the simulation model by applying a list of input stimuli representing inputs of the digital system. The simulator generates a numerical representation of the response of the circuit to the input stimuli, which response may then either be viewed on a display as a list of values or further interpreted, often by a separate software program, and presented on the display in graphical form. The simulator may be run either on a general-purpose computer or on another piece of electronic apparatus specially designed for simulation. Simulators that run entirely in software on a general-purpose computer are referred to as "software simulators," and simulators that run with the assistance of specially designed electronic apparatus are referred to as "hardware simulators."

As digital designs have become increasingly complex, digital designs are commonly simulated at several levels of abstraction, for example, at functional, logical and circuit levels. At the functional level, system operation is described in terms of a sequence of transactions between registers, adders, memories and other functional units. Simulation at the functional level is utilized to verify the high-level design of digital systems. At the logical level, a digital system is described in terms of logic elements such as logic gates and flip-flops. Simulation at the logical level is utilized to verify the correctness of the logic design. At the circuit level, each logic gate is described in terms of its circuit components such as transistors, impedances, capacitances, and other such devices. Simulation at the circuit level provides detailed information about voltage levels and switching speeds.

In order to verify the results of any given simulation run, custom-developed programs written in high-level languages such as C or C++, referred to as a reference model, are written to process input stimuli (also referred to as test vectors) to produce expected results of the simulation run. The test vector is then run against the simulation execution model by the simulator. The results of the simulation run are then compared to the results predicted by the reference model to detect discrepancies, which are flagged as errors. Such a simulation check is known in the verification art as an "end-to-end" check.

It is often the case that events of interest are quite complex in that they occur over many cycles and are composed of temporally complex interactions of a large number of signals within the given simulation model. In order to facilitate the generation and reporting of events of interest within the simulation model, the above-referenced patent application disclosed the definition of "instrumentation entities" for generating and reporting occurrences of instrumentation events within the simulation model. By associating such instrumentation entities with selected design entities comprising the digital design under simulation, complex instrumentation events can be efficiently defined, generated and reported, thus enhancing the verification process.

Although the overall simulation process is improved by the ability to efficiently instrument simulation models to detect occurrences of events of interest, the present invention recognizes that the compilation of a large number of instrumentation entities into a simulation models entails concomitant overhead in the execution of the simulation model and an increase in the amount of simulation data that must be managed. At small levels of scale (e.g., a simulation model of a portion of an integrated circuit chip) and with a relatively small number of instrumentation entity instances, the processing overhead and growth in simulation data occasioned by the instrumentation entities compiled into the simulation model are generally acceptable. However, as the scale of the simulation model increases (e.g., simulation models of large integrated circuits or large systems containing numerous integrated circuits) and the number of instrumentation entity instances grows, the simulation data and processing overhead attributable to instruction entities can become undesirably large, significantly degrading simulation performance.

Consequently, the present invention recognizes that it would be useful and desirable to enable a simulation user to control the amount of processing overhead and simulation data attributable to the inclusion of instrumentation entities in the compilation of a given simulation model.

SUMMARY OF THE INVENTION

In accordance with one embodiment of the present invention, the present invention provides an improved method, system and program product for compiling a simulation model in which a simulation user is permitted to control the amount of processing overhead and simulation data attributable to the inclusion of instrumentation entities by permitting the simulation user to selectively compile instrumentation entities into the compilation of a given simulation model.

In one embodiment of the method, a compiler receives an indication of a desired set of instrumentation entities to be included within a simulation model of a digital design described by a plurality of hierarchically arranged design entities. The instrumentation entities monitor logical operation of one or more of the plurality of design entities during simulation for occurrence of events of interest. In response to the indication, the compiler determines by reference to a bill-of-materials of a previously compiled file whether or not the previously compiled file was compiled with instrumentation entities compatible with the desired set of instrumentation entities. In response to determining that the previously compiled file was compiled with compatible instrumentation entities, the compiler compiles the simulation model of the digital design utilizing the previously compiled file in accordance with the indication.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 4C illustrates exemplary sections of HDL syntax that maybe utilized in accordance with the teachings of the present invention;

FIG. 6B depicts an exemplary embodiment of the entity tree data structure of FIG. 6A, which indicates the design entities and instrumentation entities within the sub-tree of a particular design entity;

FIG. 6D illustrates an exemplary embodiment of the constraint information data structure indicating the instrumentation entities compiled into the proto file shown in FIG. 6A;

FIG. 7 is a high level logical flowchart of an exemplary check_bom() routine by which an HDL compiler determines whether or not a previously compiled proto file can be utilized in the incremental compilation of a simulation model.

DETAILED DESCRIPTION OF ILLUSTRATIVE EMBODIMENT

Figure 1:
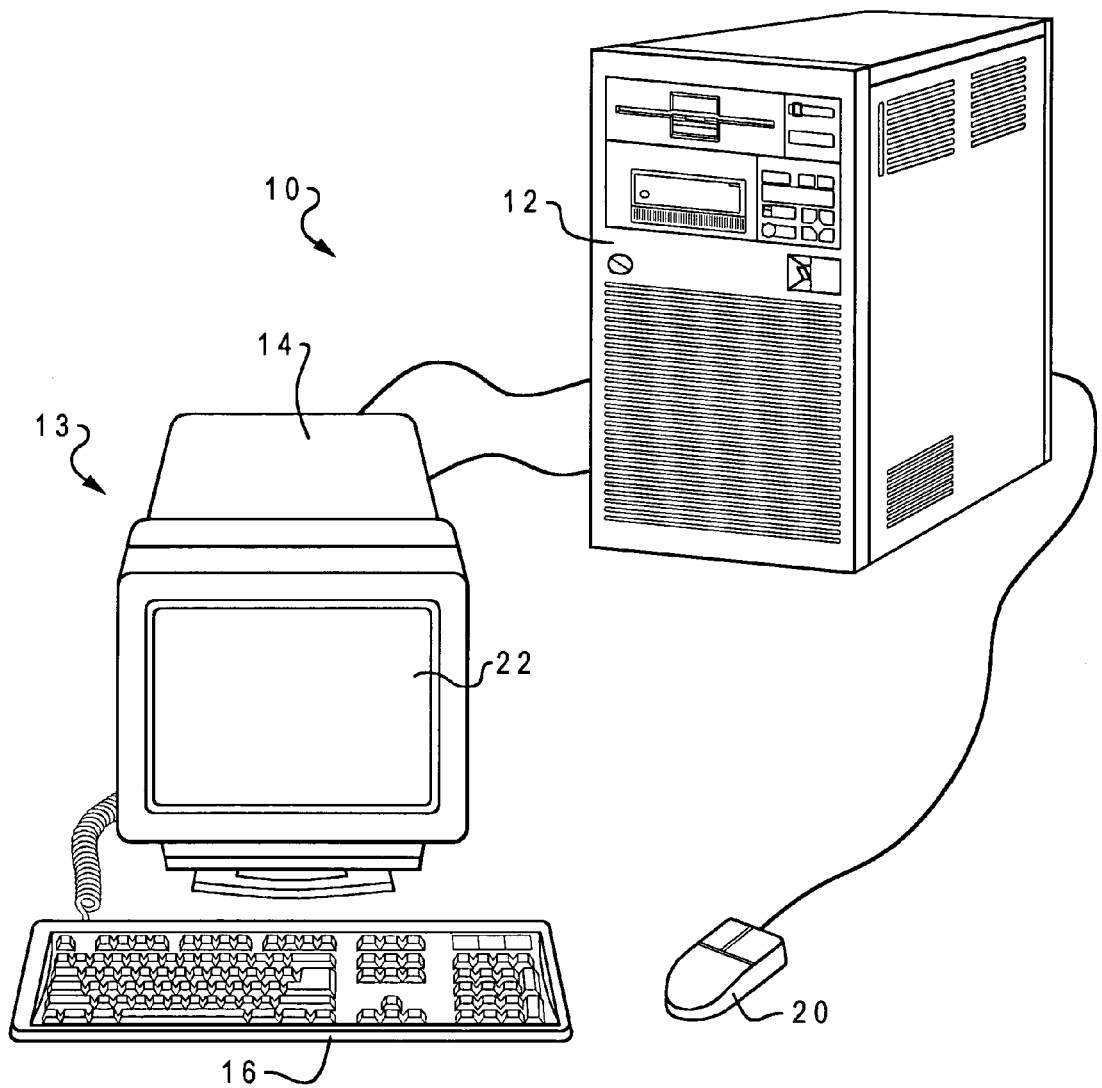
FIG. 1 is a pictorial representation of an exemplary data processing system that may be utilized to implement the present invention.

With reference now to the figures, and in particular with reference to FIG. 1, there is depicted a pictorial representation of a data processing system 10 with which the present invention may be advantageously utilized. As illustrated, data processing system 10 comprises a workstation 12 to which one or more nodes 13 are connected. Workstation 12 preferably comprises a high performance multiprocessor computer, such as the RISC System/6000 or AS/400 computer systems available from International Business Machines Corporation (IBM). Workstation 12 preferably includes nonvolatile and volatile internal storage for storing software applications comprising an ECAD system, which can be utilized to develop and verify a digital design in accordance with the method and system of the present invention. As depicted, nodes 13 are comprised of a display device 14, a keyboard 16, and a mouse 20. The ECAD software applications executed within workstation 12 preferably display a graphic user interface (GUI) within display screen 22 of display device 14 with which a digital designer can interact using a keyboard 16 and mouse 20. Thus, by entering appropriate inputs utilizing keyboard 16 and mouse 20, the digital designer is able to develop and verify a digital design according to the method described further hereinbelow.

Figure 2:
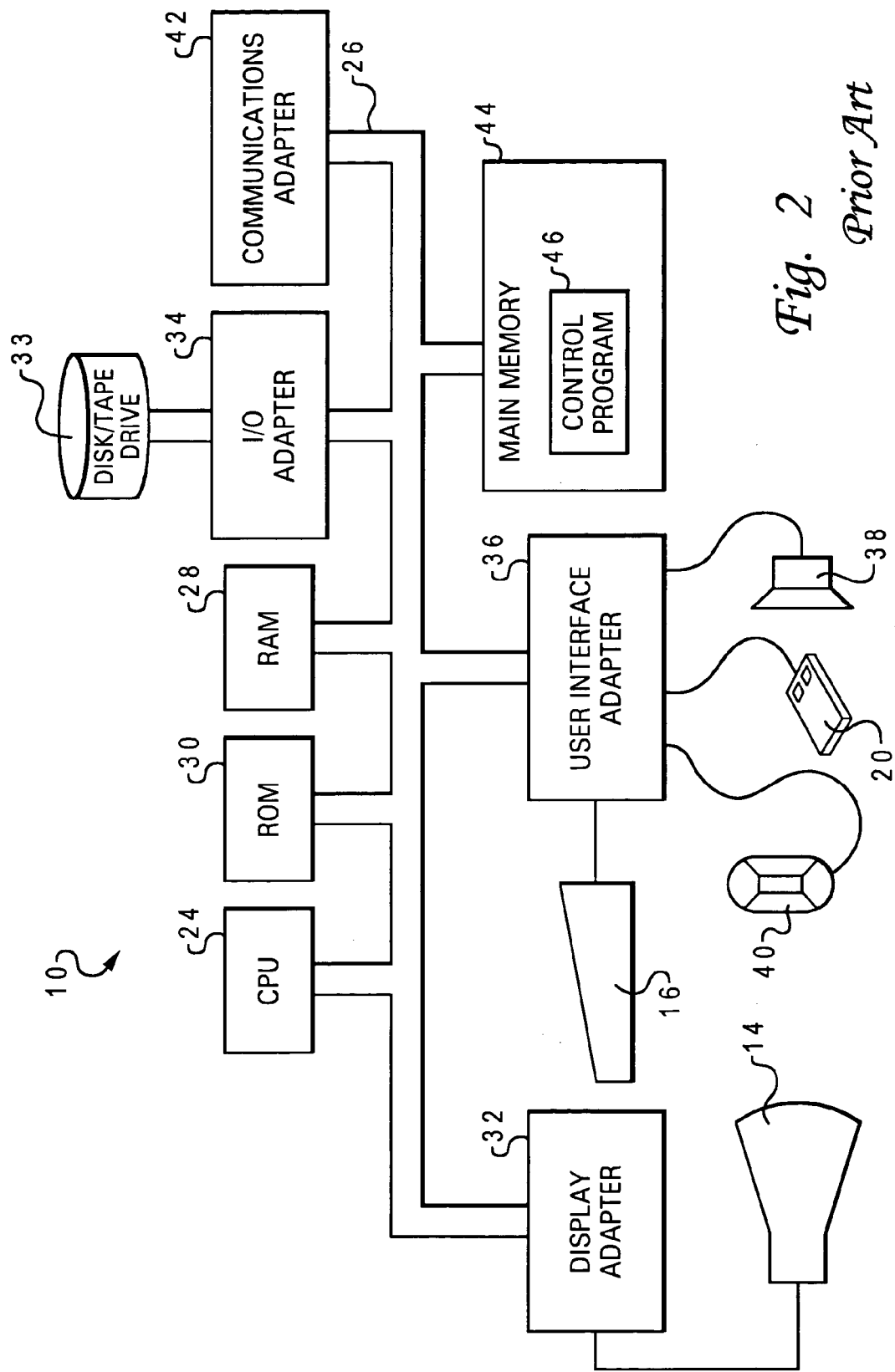
FIG. 2 depicts a representative hardware environment of the data processing system illustrated in FIG. 1.

FIG. 2 depicts a representative hardware environment of data processing system 10. Data processing system 10 is configured to include all functional components of a computer and its associated hardware. Data processing system 10 includes a Central Processing Unit (CPU) 24, such as a conventional microprocessor, and a number of other units interconnected via system bus 26. CPU 24 includes a portion of data processing system 10 that controls the operation of the entire computer system, including executing the arithmetical and logical functions contained in a particular computer program. Although not depicted in FIG. 2, CPUs such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in a system unit such as workstation 12 of FIG. 1.

Data processing system 10 further includes random-access memory (RAM) 28, read-only memory (ROM) 30, display adapter 32 for connecting system bus 26 to display device 14, and I/O adapter 34 for connecting peripheral devices (e.g., disk and tape drives 33) to system bus 26. RAM 28 is a type of memory designed such that the location of data stored in it is independent of the content. Also, any location in RAM 28 can be accessed directly without having to work through from the beginning. ROM 30 is a type of memory that retains information permanently and in which the stored information cannot be altered by a program or normal operation of a computer.

Display device 14 provides the visual output of data processing system 10. For example, display device 14 can be a cathode-ray tube (CRT) video display, a liquid crystal display (LCD), or gas plasma flat-panel display. Data processing system 10 further includes user interface adapter 36 for connecting keyboard 16, mouse 20, speaker 38, microphone 40, and/or other user interface devices, such as a touch-screen device (not shown), to system bus 26. Speaker 38 is one type of audio device that may be utilized in association with the method and system provided herein to assist diagnosticians or computer users in analyzing data processing system 10 for system failures, errors, and discrepancies. Communications adapter 42 connects data processing system 10 to a computer network. Although data processing system 10 is shown to contain only a single CPU and a single system bus, it should be understood that the present invention applies equally to computer systems that have multiple CPUs and to computer systems that have multiple buses that each perform different functions in different ways.

Data processing system 10 also includes an interface that resides within a machine-readable media to direct the operation of data processing system 10. Any suitable machine-readable media may retain the interface, such as RAM 28, ROM 30, a magnetic disk, magnetic tape, or optical disk (the last three being located in disk and tape drives 33). Any suitable operating system and associated interface (e.g., Microsoft Windows,) may direct CPU 24. For example, the AIX operating system and AIX Windows windowing system can direct CPU 24. The AIX operating system is IBM's implementation of the UNIX™ operating system. Other technologies also can be utilized in conjunction with CPU 24, such as touch-screen technology or human voice control.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the hardware depicted. In addition, main memory 44 is connected to system bus 26, and includes a control program 46. Control program 46 resides within main memory 44, and contains instructions that, when executed on CPU 24, carries out the operations depicted in FIGS. 4D, 4E, 7 and 8 and described below.

Figure 3A:
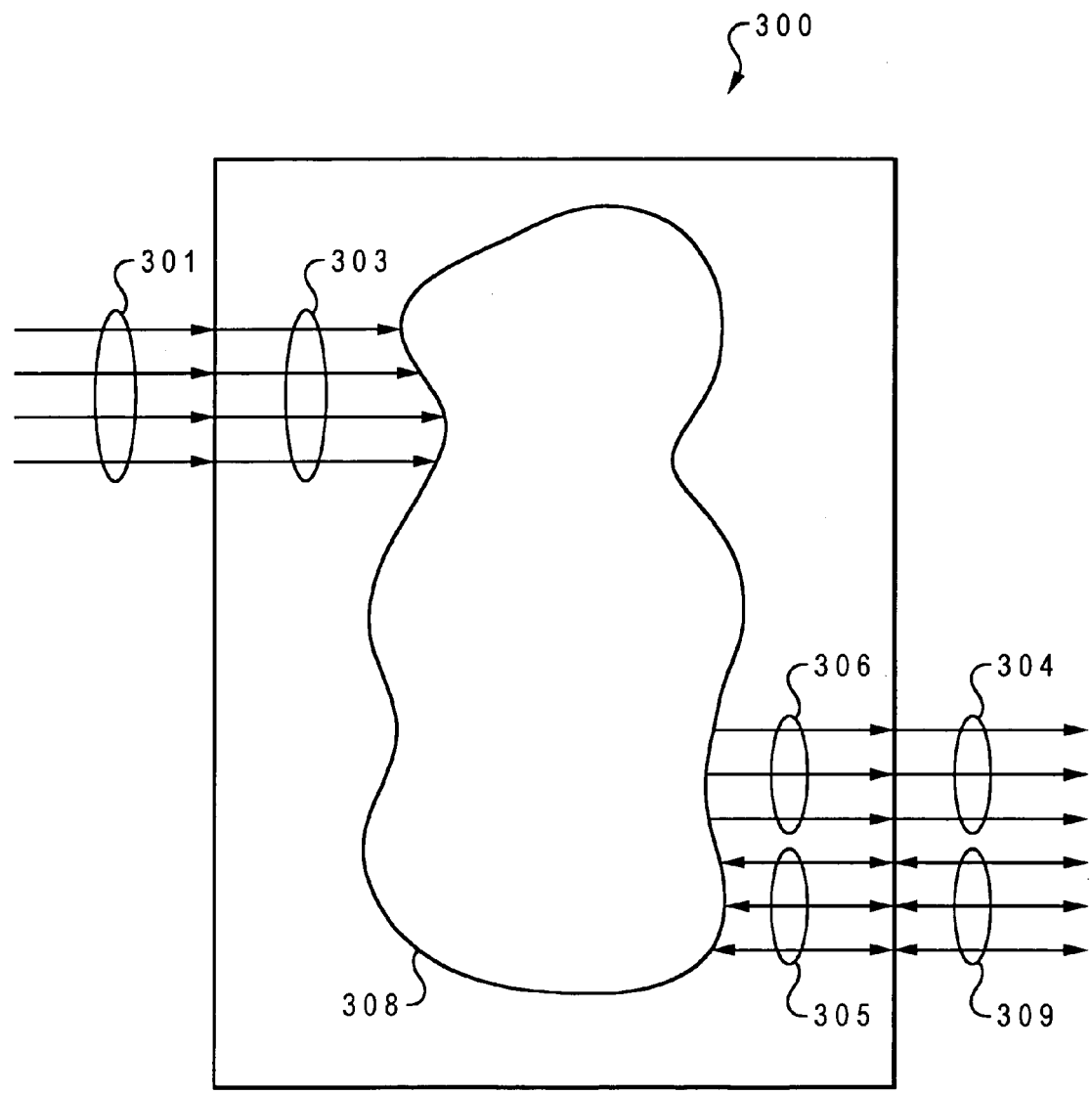
FIG. 3A is a simplified block diagram illustrating a digital design entity that may be instrumented in accordance with the teachings of the present invention.

Simulated digital design models are comprised of at least one and usually many sub-units referred to hereinafter as design entities. FIG. 3A is a block diagram representation of an exemplary design entity 300 in accordance with the present invention. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) indicates a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
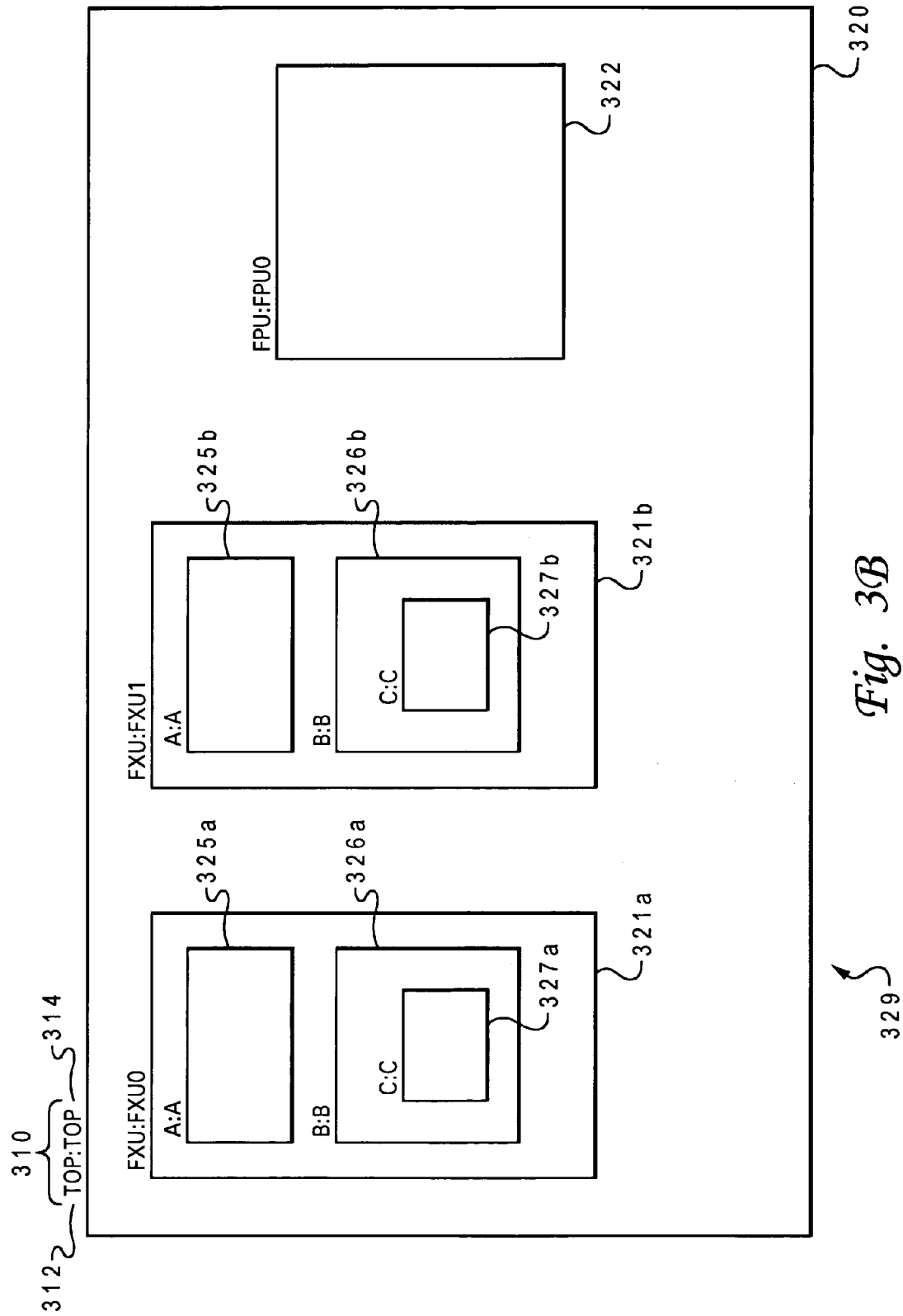
FIG. 3B is a diagrammatic representation depicting a simulation model that may be instrumented in accordance with the teachings of the present invention.

Referring now to FIG. 3B, there is illustrated a diagrammatic representation of an exemplary simulation model 329 that may be utilized in a preferred embodiment of the present invention. Simulation model 329 includes multiple hierarchical entities. For visual simplicity and clarity, the ports and signals interconnecting the entities within simulation model 329 have not been explicitly shown. In any model, one and only one entity is the so-called "top-level entity". A top-level entity 320, is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321*a* and 321*b*, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321*a* and 321b of FXU entity 321. Instantiations 321a and 321b are distinct instantiations of FXU entity 321 with instantiation names FXU0 and FXU1, respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326, respectively, are directly instantiated. Similarly, instantiation 321b of the same FXU entity contains instantiations 325b and 326b of entity A 325 and entity B 326, respectively. In a similar manner, instantiation 326a and instantiation 326b each directly instantiate a single instance of entity C 327 as entities 327a and 327b, respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 3C:
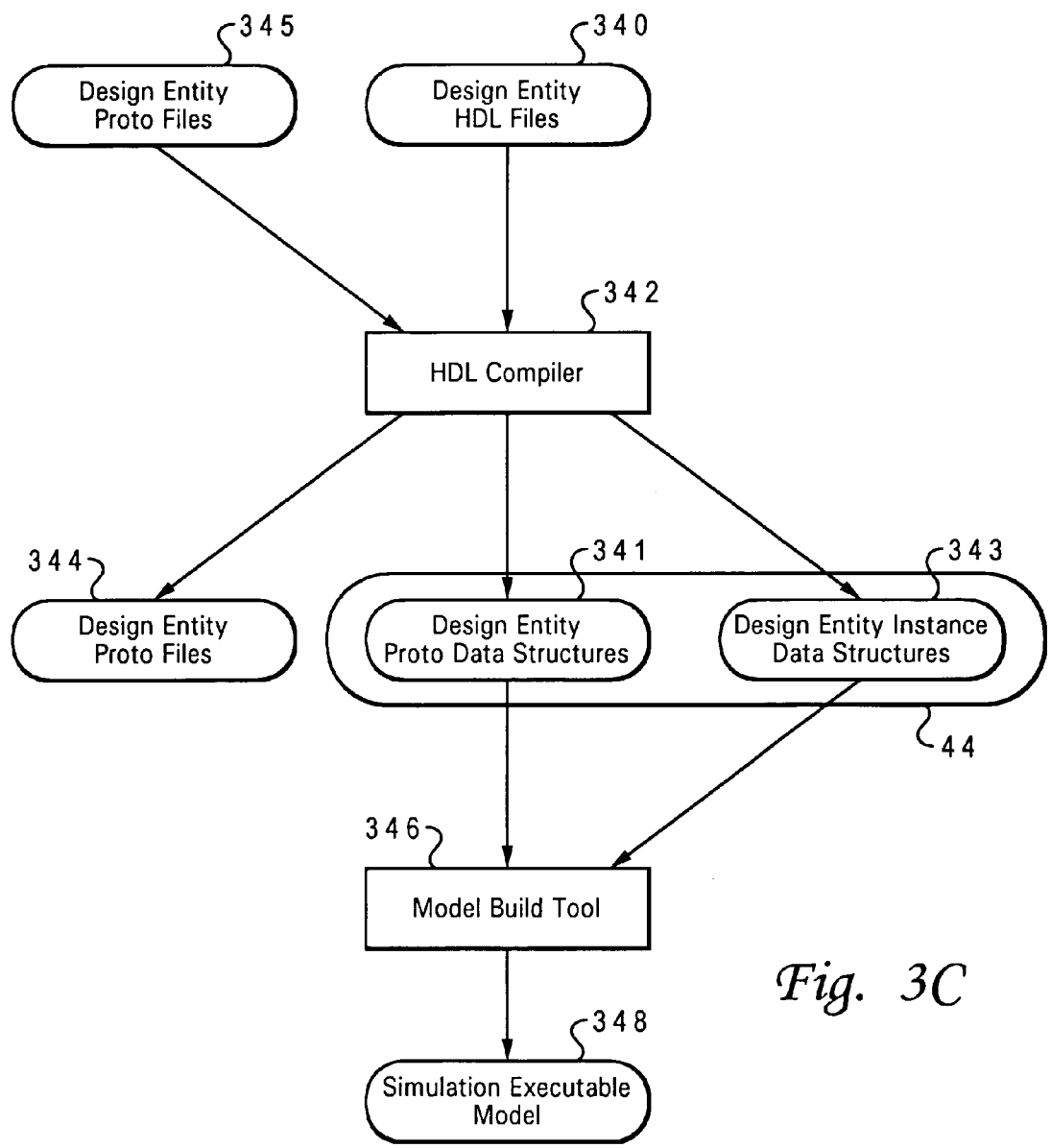
FIG. 3C is a flow diagram illustrating a model build process that may be implemented in accordance with the teachings of the present invention.

Referring now to FIG. 3C, there is depicted an exemplary flow diagram of a model build process that may be implemented in accordance with one embodiment of the present invention. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342, examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344, for use in subsequent compilations. Such a process will be referred to hereinafter as "incremental compilation" and can greatly speed the process of creating a simulation executable model 348. Incremental compilation is described in further detail hereinbelow. Once created by HDL compiler 342, proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343 serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs, it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU: FXU1 321b, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent, and HDL compiler 342 will recompile HDL file 340 on a subsequent re-compilation, as will be described in further detail below. For example, returning to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                                    5
{                                                         10
    if (NOT proto_loaded(file)) {                         15
        if (exists_proto_file(file) AND check_bom(file)) {  20
            load_proto(file);                             25
        } else {                                          30
            parse_HDL_file(file)                          35
            for (all instances in file) {                 40
                process_HDL_file(instance);               45
            }                                             50
            create_proto(file);                           55
            write_proto_file(file);                       60
        }                                                 65
    }                                                     70
    create_instance(file):                                75
}                                                         80
```

When compiler 342 is initially invoked, no proto data structures 341 or instance data structures 343 are present in memory 44 of computer system 10. The main control loop, routine process_HDL_file() (line 5), is invoked and passed the name of the top level entity by means of parameter "file". The algorithm first determines if a proto data structure for the current entity is present in memory 44 by means of routine proto_loaded() (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance() (line 75). The create_instance() routine preferably creates the necessary instance data structures for the sub-tree, if any, of the current entity recursively.

However, if a matching proto data structure is not present in memory 44, control passes to line 20 where routine exists_proto_file() examines proto files 345 to determine if a proto file exists for the entity. If and only if a matching proto file exists, routine check_bom() is called to determine whether proto file 345 is consistent. In order to determine whether the proto file is consistent, the BOM for the proto file is examined. Routine check_bom() examines each HDL source code file listed in the BOM to determine if the date or time stamps for the HDL source code file have changed or if the HDL source code file has been deleted. If either condition occurs for any file in the BOM, the proto file is inconsistent and routine check_bom() fails. However, if check_bom() is successful, control is passed to line 25 where routine load_proto() loads the proto file and any descendant proto files into memory 44, thus creating proto data structures 341 for the current entity and the current entity's descendants, if any. In a preferred embodiment, load_proto() recursively loads the proto data structures for the entire sub-tree, if any, of the current entity. The construction of process_HDL_file() ensures that once a proto file has been verified as consistent, all of its descendant proto files, if any, are also consistent.

If the proto file is either non-existent or is not consistent, control passes to line 35 where routine parse_HDL_file() loads the HDL source code file for the current entity. Routine parse_HDL_file() (line 35) examines the HDL source code file for syntactic correctness and determines which descendant entities, if any, are instantiated by the current entity. Lines 40, 45, and 50 constitute a loop in which the routine process_HDL_file() is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto(). Control then passes to line 60 where a new proto file 344, including an associated BOM, is written to disk 33 by routine write_proto_file(). Finally, control passes to line 75 where routine create_instance() creates instance data structures 343 for the current entity and any descendant entities as necessary. As noted above, the create_instance() routine preferably recursively creates the necessary instance data structures for the sub-tree, if any, of the current entity. In this manner, process_HDL_file() (line 5) recursively processes the entire simulation model creating an in-memory image of the model consisting of proto data structures 341 and instance data structures 343.

Figure 3D:
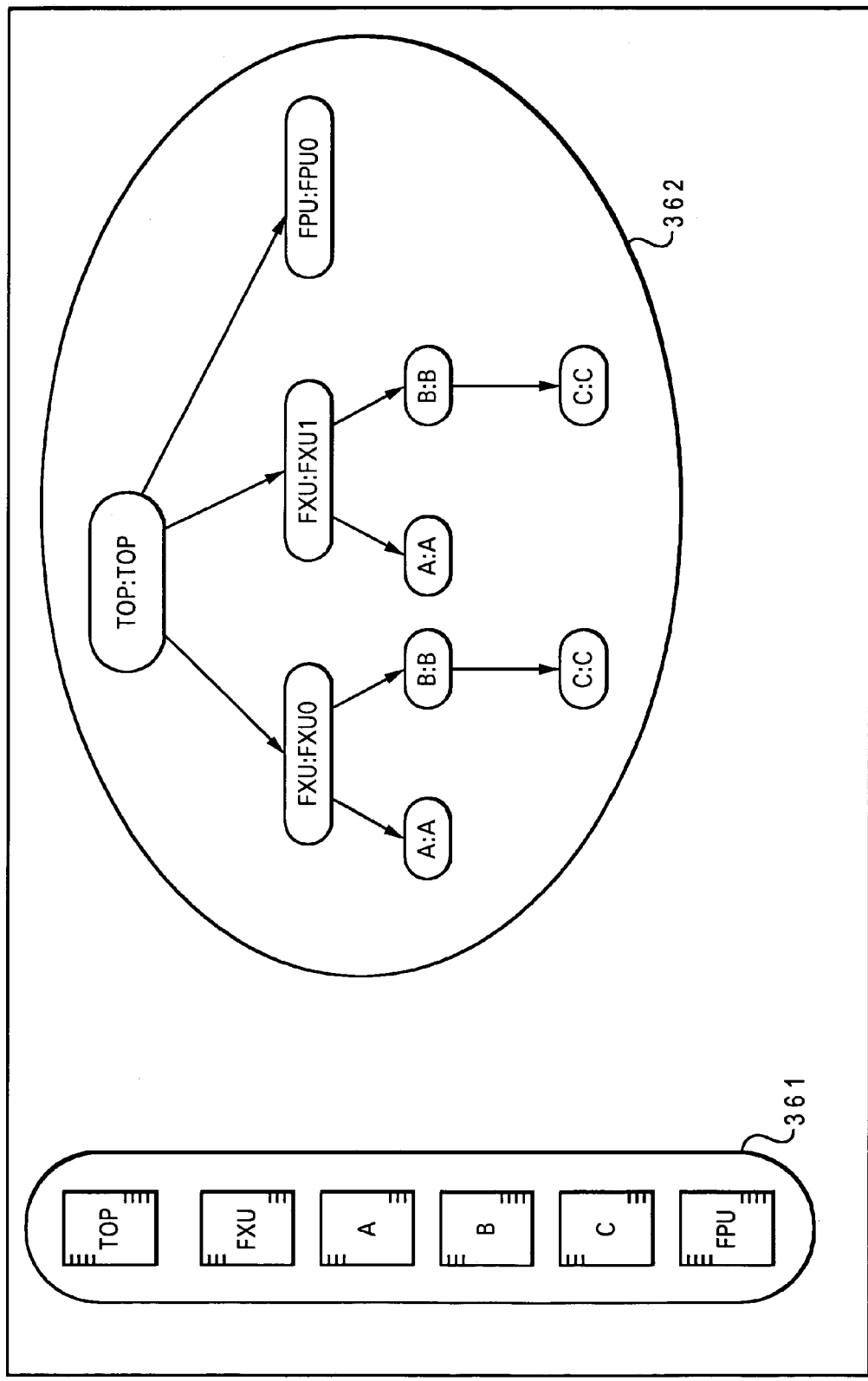
FIG. 3D is a block diagram depicting data structures that may be instrumented in accordance with the teachings of the present invention.

With reference now to FIG. 3D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 3C processes the contents of memory 44 into memory data structures in order to produce simulation executable model 348.

In order to instrument simulation models, the present invention makes use of entities known as "instrumentation entities," which monitor the logical operations of the entities constituting a design which are referred to herein as "design entities". Unlike design entities, instrumentation entities do not contribute to the logical function(s) of the digital design under test, and accordingly can be selectively or wholly omitted from the digital design without changing its logical operation. As with design entities, instrumentation entities are described by one or more HDL source code files and consist of a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
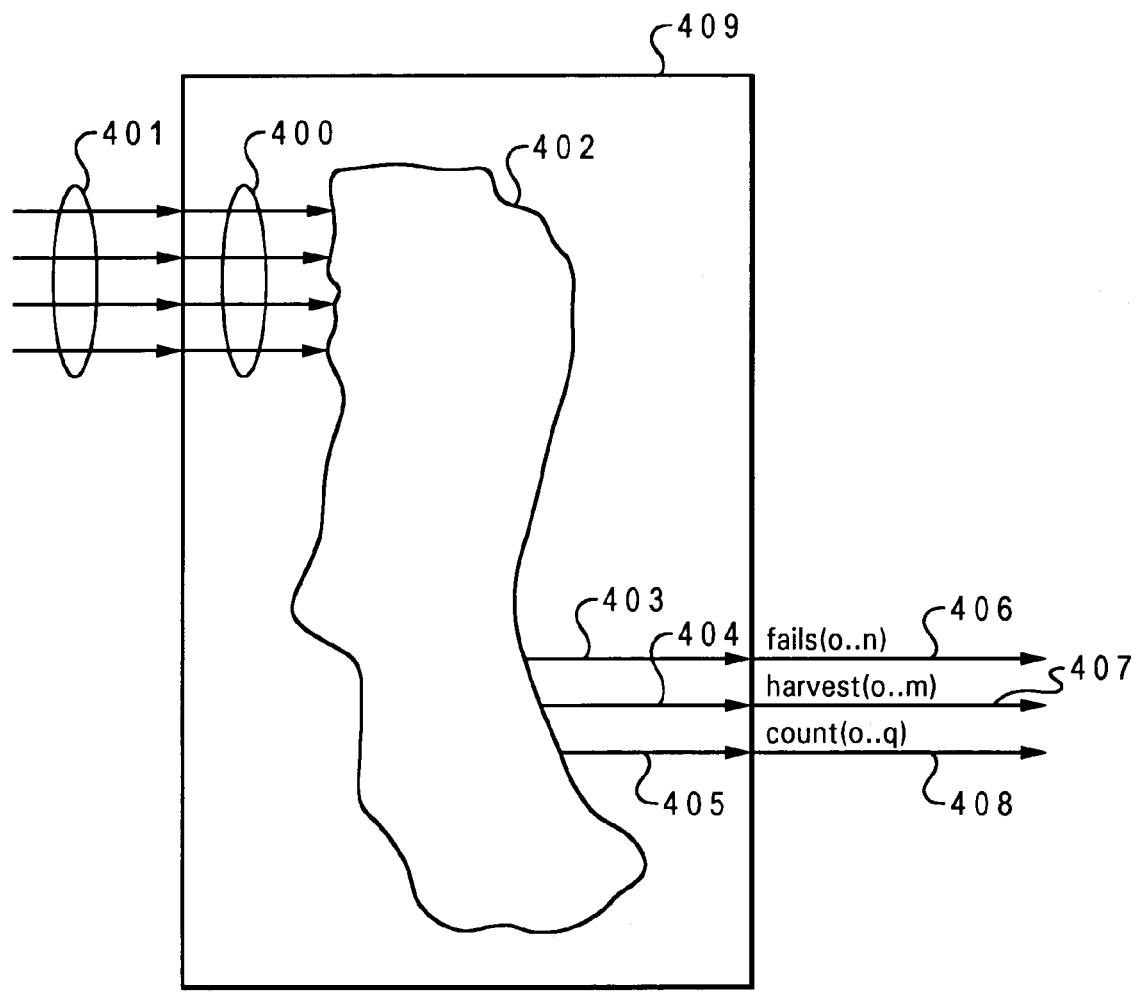
FIG. 4A is a simplified block diagram representative of an instrumentation entity.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. Three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 4B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 4B:
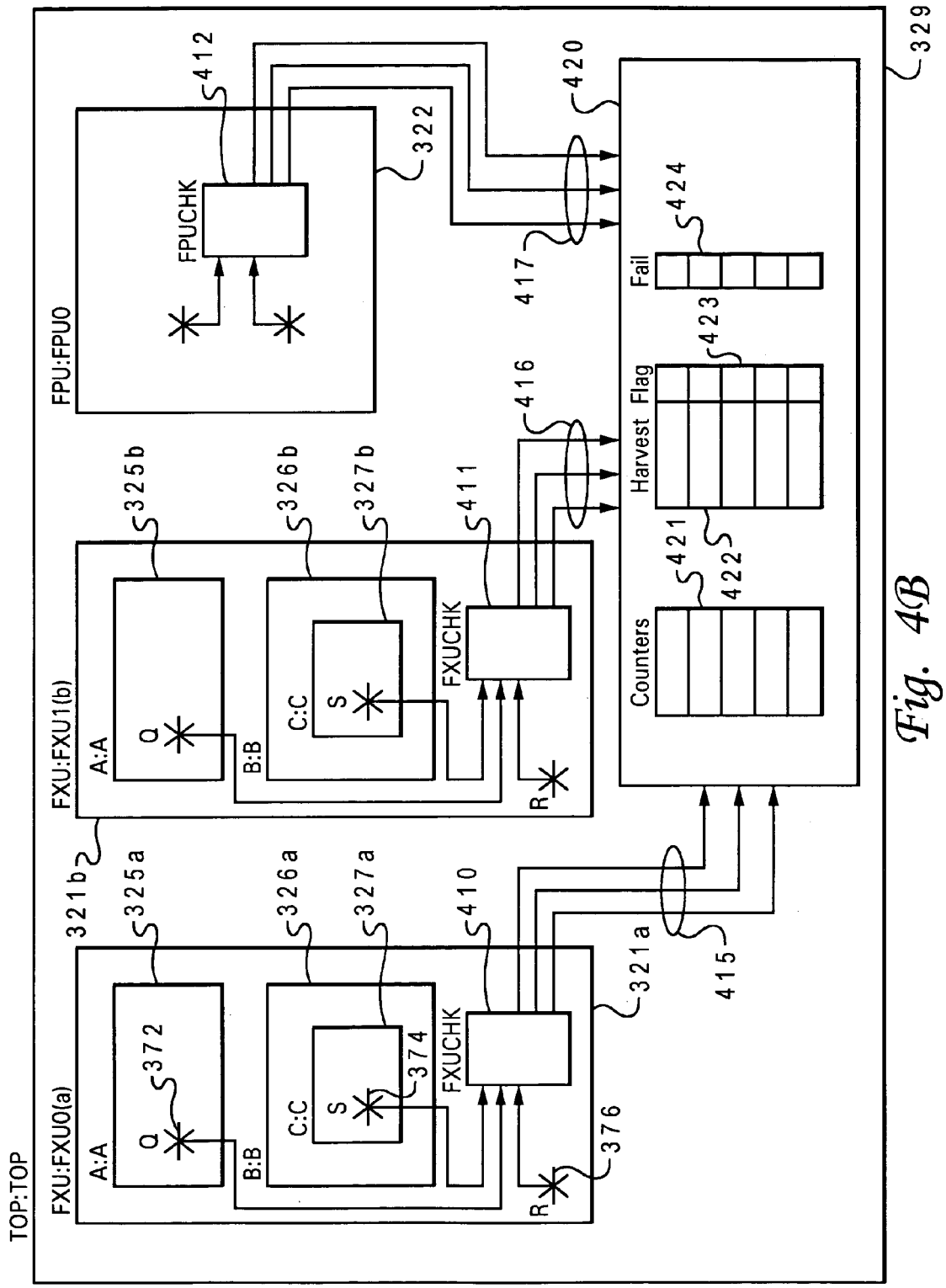
FIG. 4B is a simplified block diagram of a simulation model instrumented in accordance with the teachings of the present invention.

With reference now to FIG. 4B, wherein is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321a and 321b of an FXU entity. For each FXU instantiations of 321a and 321b, a respective one of FXUCHK instantiations 410 and 411 is automatically generated by the mechanism of the present invention. In a similar fashion, instrumentation entity FPU-CHK 412 is instantiated to monitor FPU entity 322.

As depicted in FIG. 4B, entity FXUCHK monitors a signals Q 372, a signal R 376, and a signal S 374 within each of instances 321a and 321b of the FXU entity. Signal Q 372 is a signal within the instances 325a and 325b of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 is utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary HDL file 440 that describes instrumentation entity FXUCHK depicted in FIG. 4B. HDL file 440 utilizes the syntax of the VHDL hardware description language. In the VHDL language, lines beginning with two dashes (i.e., "--") are recognized by a compiler as being comments. The method and system of the present invention utilize comments of a non-conventional form to indicate information about an instrumentation entity. FIG. 4C depicts one embodiment of the present invention in which comments begin with two exclamation points in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376, respectively, as described below. Input port CLOCK is also declared and will be connected to a signal CLOCK within the FXU entity. In addition, three output ports are declared: fails (0 to 1), counts(0 to 2), and harvests(0 to 1). These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 are utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity, which in HDL file 440 is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases, a signal to be monitored lies within a descendant of a target entity. This is the case for signal S 374, which is embedded within entity C which is a descendant of entity B 326 and target FXU entity 321. Input port map 453 includes an identification string for signal S 374, which consists of the instance names of the entities within the target entity each separated by periods ("."). This identification string is pre-pended to the signal name. The signal mapping comment within input port map 453 for signal S 374 is therefore as follows:

--!!S_IN=>B.C.S

This syntax allows an instrumentation entity to connect to any signal within the target entity or the target entity's descendant entities. A signal appearing on the top level of the target design entity, has no pre-pended entity names; and therefore, has the following signal mapping comment:

--!!R_IN=>R

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal where signal is a legal signal name without periods ("."), then the input port mapping comment is not required and the system of the present invention will automatically make the connection. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname>"failure message";" where n is an integer denoting the failure event to which the message is associated, <eventname> is the unique failure event name, and "failure message" is the message associated with the particular failure event. One, and only one, failure message declaration comment must be provided for each failure event monitored by the instrumentation entity.

Counter declaration comments 455 begin with a comment of the form "--!! Count Outputs;", and end with a comment of the form "--!! End Count Outputs;". Each count event output is associated with a unique variable name. This name is associated with a counter in counter logic 421 of FIG. 4B. The variable name provides a means to identify and reference the particular counter associated with a particular count event. Thus, a comment of the form "—!! n: <varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described hereinbelow. The parameter "qualifying_signal" is followed by "+/−" to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name, and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event (count, fail and harvest) within the model in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 4D:
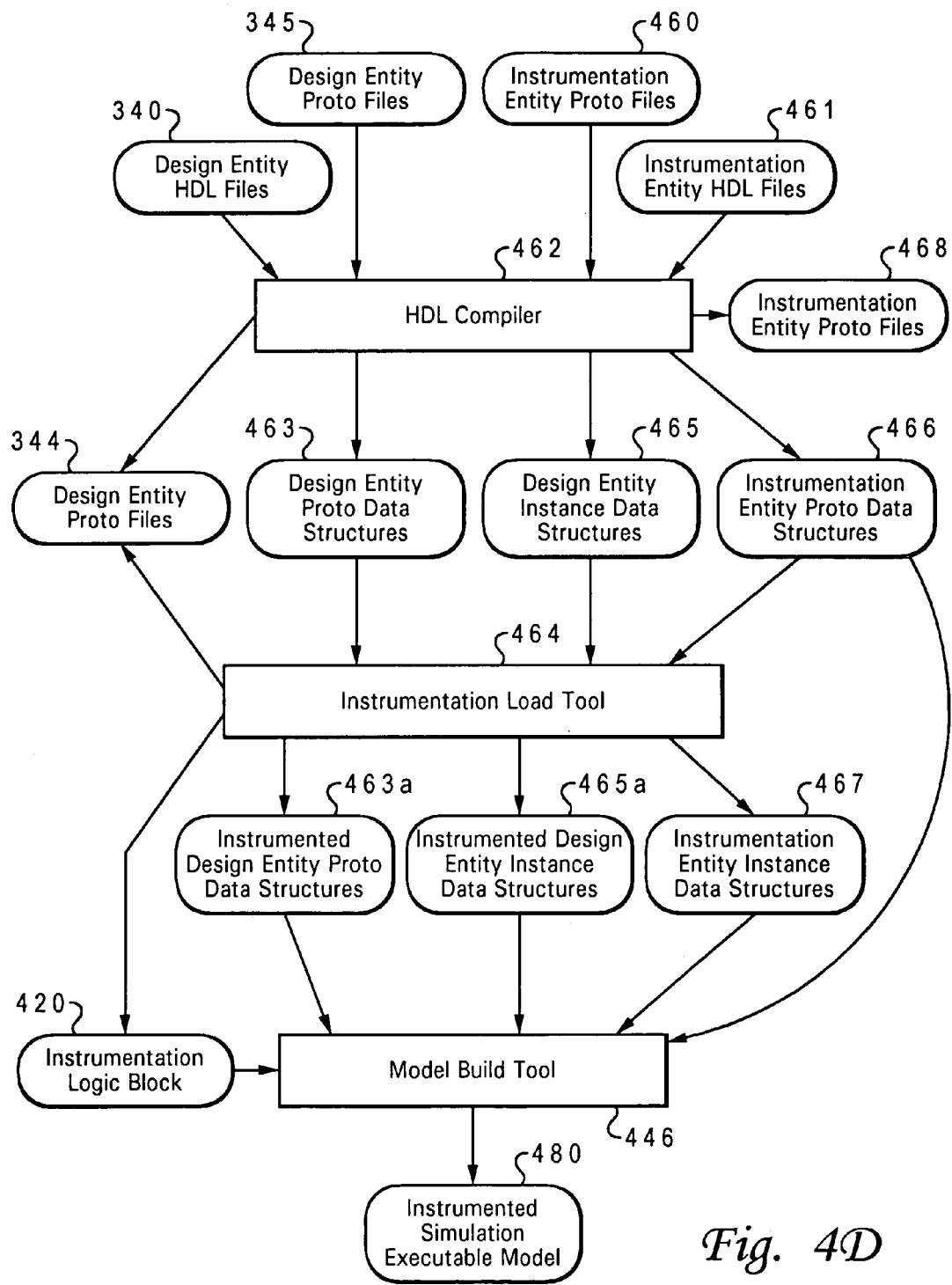
FIG. 4D is a flow diagram depicting a model build process in accordance with the teachings of the present invention.

With reference now to FIG. 4D, there is depicted a model build process in accordance with the teachings of the present invention. In this model build process, instrumentation load tool 464 is utilized to alter the in-memory proto and instance data structures of a simulation model, thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 4D begins with design entity HDL files 340, instrumentation entity HDL files 461, and, optionally:

(1) one or more design entity proto files 345 (available from a previous run of HDL compiler 462);

(2) one or more instrumentation entity proto files 460 (available from a previous run of HDL compiler 462); and (3) an instrumentation control file 469 indicating which instrumentation entities the simulation user desires to be compiled into the simulation model by HDL compiler 462.

HDL compiler 462 processes design entity HDL files 340, and instrumentation entity HDL files 461 utilizing a version of the process_HDL_file() routine described above that is enhanced to promote efficient incremental compilation of the design and instrumentation entities comprising a simulation model. HDL compiler 462 loads proto data structures from design entity proto files 345 and the instrumentation entity protos files 460 indicated by instrumentation control file 469, if such proto files are available and consistent. If such proto files are not available or are not consistent, HDL compiler 462 compiles design entity HDL files 340 and the selected instrumentation entity HDL files 461 indicated by instrumentation control file 469 in order to produce design entity proto files 344 and instrumentation entity proto files 468. (Design entity proto files 344 and instrumentation entity proto files 468 are available to serve as design entity proto files 345 and instrumentation entity proto files 460, respectively, for a subsequent run of HDL compiler 462.)

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures for instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes the unaltered design proto data structure 463 to instrumented design proto data structure 463a, and passes design instance data structure 465 to instrumented design instance data structure 465a.

If, however, a target entity is loaded from design entity HDL files 340 rather than from design entity proto files 345, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Model build tool 446 processes in-memory proto and instance data structures 463a, 465a, 467, 466 to produce instrumented simulation executable model 480.

In HDL compiler 462, the process_HDL_file() routine is augmented to allow for the incremental compilation of design and instrumentation entities. A pseudocode implementation of a main control loop of HDL compiler 462 that includes in the resulting simulation model all instrumentation entities defined in the design hierarchy is shown below:

```
process_HDL_file2(file,design_flag)              5
{                                                10
    if (NOT proto_loaded(file)) {                15
        if (exists_proto_file(file) AND check_bom(file)) {  20
            load_proto(file);                    25
        }else {                                  30
            parse_HDL_file(file)                 35
            for (all instances in file) {        40
                process_HDL_file2(instance, design_flag);  45
            }                                    50
            if (design_flag=TRUE) {              55
                for (all instrumentation
                    instances in file){          60
                    process_HDL_file2(instance, FALSE);  65
                }                                70
            }                                    75
            create_proto(file);                  80
            write_proto_file(file);              90
        }                                        95
    }                                            100
    if (design_flag = TRUE) {                    105
        create_instance(file);                   110
    }                                            115
}                                                120
```

Algorithm process_HDL_file2() is an augmentation to process_HDL_file() of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2() (line 5) first checks, by means of routine proto_loaded() (line 15), if the proto for the current entity is already present in memory 44. If so, processing passes to line 105. Otherwise, control is passed to line 20 and 25 where disk 33 of computer system 10 is examined to determine if proto files for the entity and its descendants (including instrumentation entities, if any) exist and are consistent. If so, the appropriate proto files are loaded from disk 10 by routine load_proto() (line 25) creating proto data structures, as necessary, in memory 44 for the current entity and the current entity's descendants including instrumentation entities. As noted above, load_proto() preferably loads the sub-tree, if any, of the current entity into memory 44 recursively.

If the proto file is unavailable or inconsistent, control passes to line 35 where the current entity HDL file is parsed. For any entities instantiated within the current entity, lines 40 to 55 recursively call process_HDL_file2() (line 5) in order to process these descendants of the current entity. Control then passes to line 55 where the design_flag parameter is examined to determine if the current entity being processed is a design entity or an instrumentation entity. If the current entity is an instrumentation entity, control passes to line 80. Otherwise, the current entity is a design entity and lines 60 to 70 recursively call process_HDL_file2() (line 5) to process any instrumentation entities instantiated by means of instrumentation instantiation comments. It should be noted that algorithm process_HDL_file2() (line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed, to disk 33 of computer system 10.

Control finally passes to line 105 and 110 where, if the current entity is a design entity, instance data structures are created as needed for the current entity and the current entity's descendants. If the current entity is an instrumentation entity, routine create_instance() (line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 4E:
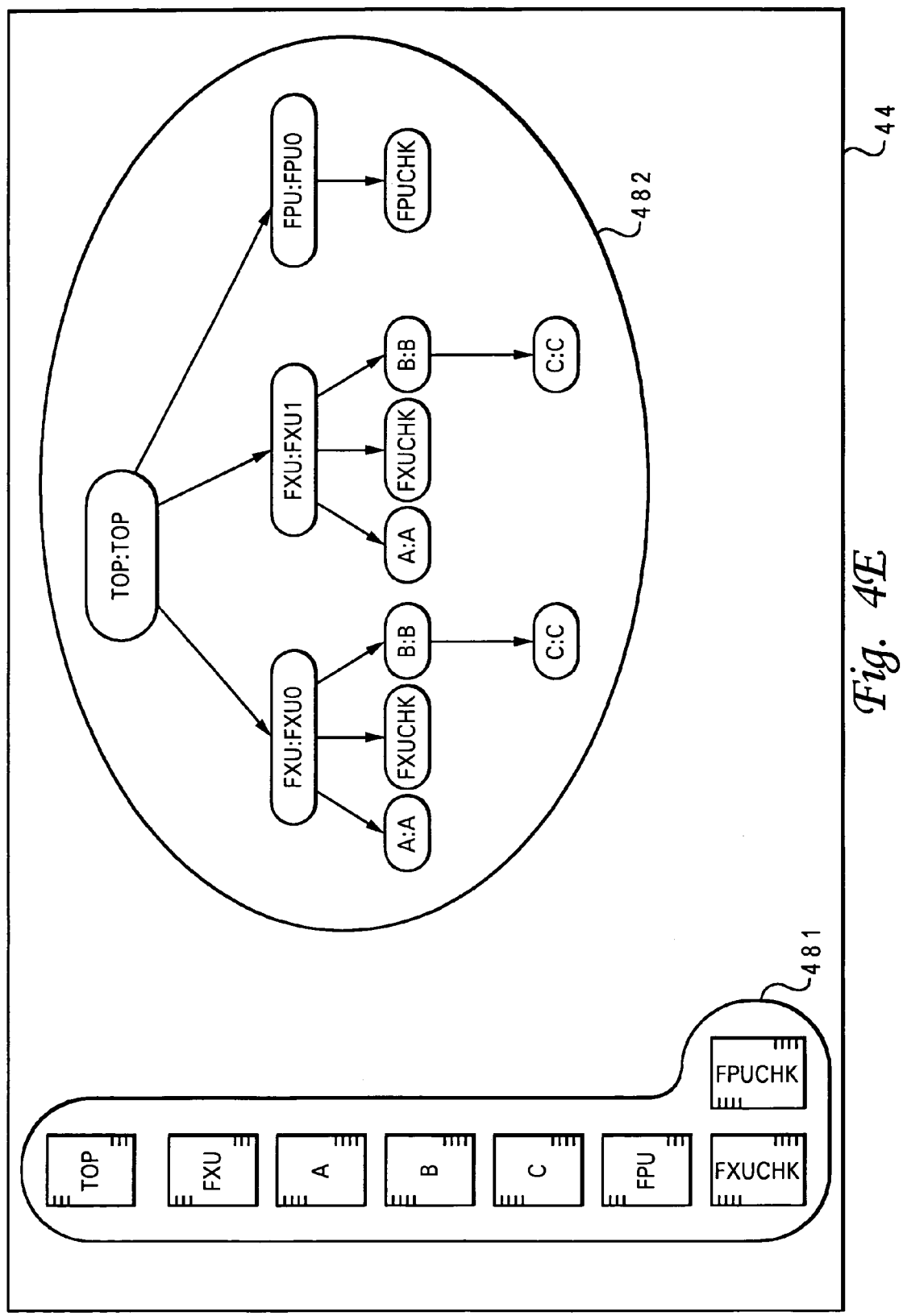
FIG. 4E is a block diagram representation of memory data structures constructed in accordance with the teachings of the present invention.

With reference now to FIG. 4E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

The incremental compilation process described to this point facilitates the efficient construction of simulation models of arbitrary scale utilizing the results of previous compilations. In particular, by utilizing design and instrumentation entity proto files resulting from previous compilations, the number of HDL source code files that must be parsed and processed to generate a simulation model is reduced, greatly accelerating the compilation process.

Although the overall simulation process is thus improved by the ability to more quickly compile new simulation models reflecting modifications to the size or content of previous models, it will be appreciated that the overall simulation process depends not only upon the facility with which simulation models can be generated, but also upon the resulting size of the simulation model. Each instrumentation entity instance compiled into a simulation model adds overhead to the execution of the simulation model and increases the amount of simulation data that must be processed. As noted above, at small levels of scale (e.g., a simulation model of a portion of or an entire integrated circuit chip) and with relatively few instrumentation entity instances, the processing overhead and amount of simulation data attributable to the instrumentation entities compiled into the simulation model is generally acceptable as a percentage of the execution time for the simulation model. However, as the number of instrumentation entity instances and the scale of the simulation model increase (e.g., simulation models of large integrated circuit chips or large systems containing numerous integrated circuit chips), the processing overhead and amount of simulation data attributable to instrumentation entities can become undesirably large.

Consequently, it would be useful and desirable to enable a user to control the amount of processing overhead and simulation data attributable to instrumentation entities by allowing the user to specify which instrumentation entities are to be compiled into a given simulation model. Because, in practice, simulation of a digital design is often conducted by simulation users who do not belong to the design team responsible for creating and modifying the HDL source code files defining the design entities and instrumentation entities comprising a simulation model, it is further desirable if the selection of which instrumentation entities to include within a particular compilation of a simulation model can be made by simulation users having limited knowledge of the design and without requiring and/or permitting modification to the design team's HDL source code. These features and advantages may be achieved utilizing the present invention, as described further below.

Figure 5:
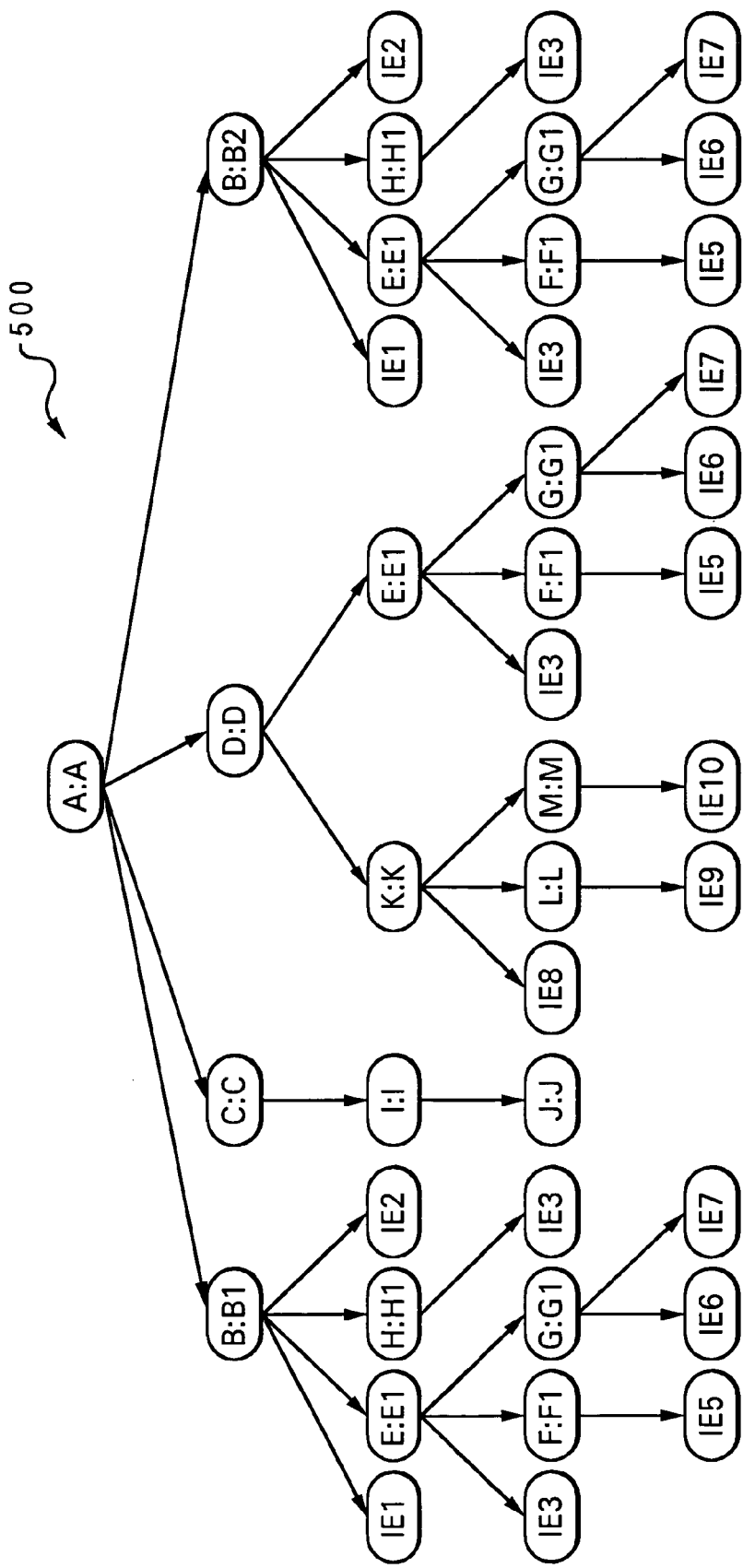
FIG. 5 depicts an exemplary design hierarchy of a digital system that includes a number of instrumentation entities.

Referring now to FIG. 5, there is depicted a diagrammatic representation of an exemplary design hierarchy 500 of a digital design to be simulated. As shown, design hierarchy 500 includes a number of instances of design entities A through M, each designated by an identifier of the form "entity name:instance name," as described above. In addition, design hierarchy 500 includes a number of instances of instrumentation entities (IEs) designated by instrumentation entity names IE1 through IE10. Design hierarchy 500 further indicates the hierarchical relationships between the design and instrumentation entities in that each design entity is linked by an arrow to each other design or instrumentation entity that it directly instantiates (or, in the case of instrumentation entities, may optionally directly instantiate in a given simulation model).

It will be appreciated that design hierarchy 500 of FIG. 5 represents the maximum number of instrumentation entities that may be compiled into a simulation model generated from the HDL source code files corresponding to the illustrated design entities. In accordance with the present invention, a simulation user can specify which, if any, of IE1 through IE 10 is included in the simulation executable model by HDL compiler 462 during an incremental compilation process by providing HDL compiler 462 an instrumentation control file 469, as mentioned briefly above.

Although the constraints regarding which instrumentation entities the simulation user desires to include within a compilation can be expressed within instrumentation control file 469 in a variety of ways, an exemplary embodiment of the present invention supports three types of constraint directives within instrumentation control file 469 and two possible constraint "polarities". The constraint directives specify a set of instrumentation entities, and a polarity parameter specifies whether the constraint directives should be interpreted as "include" directives indicating that the specified instrumentation entities should be included (and by implication that other non-specified instrumentation entities should be excluded) or "exclude" directives indicating that the specified instrumentation entities should be excluded (and by implication that other non-specified instrumentation entities should be included).

In the exemplary embodiment, the possible types of constraint directives include the following:
 (1) [design_entity]—a design-entity-specific directive which specifies all instrumentation entities within the named design entity;
 (2) {design_entity}—a design entity sub-tree directive which specifies all instrumentation entities within the named design entity as well as those within the named design entity's descendant design entities, if any; and
 (3) <instrumentation_entity>—an instrumentation-entity-specific directive which specifies a given instrumentation entity by name.

The polarity parameter, which has the value of either INCLUDE or EXCLUDE, indicates whether the instrumentation entities specified by the constraint directives should be included or excluded from the simulation model, respectively. Thus, if the polarity parameter has the value INCLUDE, HDL compiler 462 will compile into the simulation executable model only those instrumentation entities that are specified by the constraint directives, and exclude all others by default. Likewise, if the polarity parameter has the value EXCLUDE, HDL compiler 462 will exclude from the simulation executable model only those instrumentation entities that are specified by the constraint directives and include all others by default.

For example, an illustrative instrumentation control file 469 that may be utilized to constrain which instrumentation entities within design hierarchy 500 are compiled into the simulation executable model is given as follows:

```
INCLUDE
[F]
{K}
<IE1>
```

In the exemplary instrumentation control file 469, the polarity parameter INCLUDE indicates that only the instrumentation entities specified by the constraint directives will be included in the simulation executable model. The set of included instrumentation entities contains IE5, which is specified by the constraint directive "[F]", IE8, IE9 and IE10, which are specified by the constraint directive "{K}", and IE1, which is specified by constraint directive "<IE1>".

The illustrative constraint system described above has a number of advantages that simplify constraint processing. First, because only a single polarity parameter is permitted in each instrumentation control file 469, constraint directives cannot conflict. While it is true that constraint directives may overlap in that multiple constraint directives may specify the same instrumentation entity, any such overlap only serves to re-enforce which instrumentation entities are included or excluded. Second, the constraint directives in the exemplary embodiment apply to all instances of the identified design entities or instrumentation entities. Although it is possible in other embodiments to permit constraint directives to be expressed for individual design entity instances, such an implementation would require separate proto files to be stored for different instances of the same design entity, which would significantly complicate and slow the incremental compilation process. Third, the three types of constraint directives supported in the exemplary embodiment are well adapted to efficiently express the most common cases in practice, namely, the inclusion or exclusion of most instrumentation entities.

The selective inclusion of instrumentation entities within an incrementally compiled simulation executable model in the manner described above introduces a new restriction on the use of stored proto files as "building blocks" of a new simulation executable model. In particular, in order to be used in an incremental compilation, the proto file saved in non-volatile storage must have been compiled with a set of constraint directives that specify the same set of included/ excluded instrumentation entities as required for the current compilation. In other words, the proto file must be consistent not only with respect to the underlying design and instrumentation entity HDL source code files (as evidenced by consistent time and date stamps), but also with respect to the constraint directives under which the proto file was compiled.

In order to support verification of the constraint directives under which a proto file was previously compiled, the BOM for each proto file is augmented with additional information pertaining to constraint directives under which the proto file was compiled. In addition, as described further below with respect to FIG. 7, the check_bom() routine described above with respect to line 20 of the pseudocode of process_HDL_ file2() is augmented to include not only a time and date stamp check, but also an instrumentation check to verify that the instrumentation entities actually present in the proto file are consistent with the instrumentation entities specified by the constraint directives, if any, within the instrumentation control file 469 referenced in the current compilation.

Figure 6A:
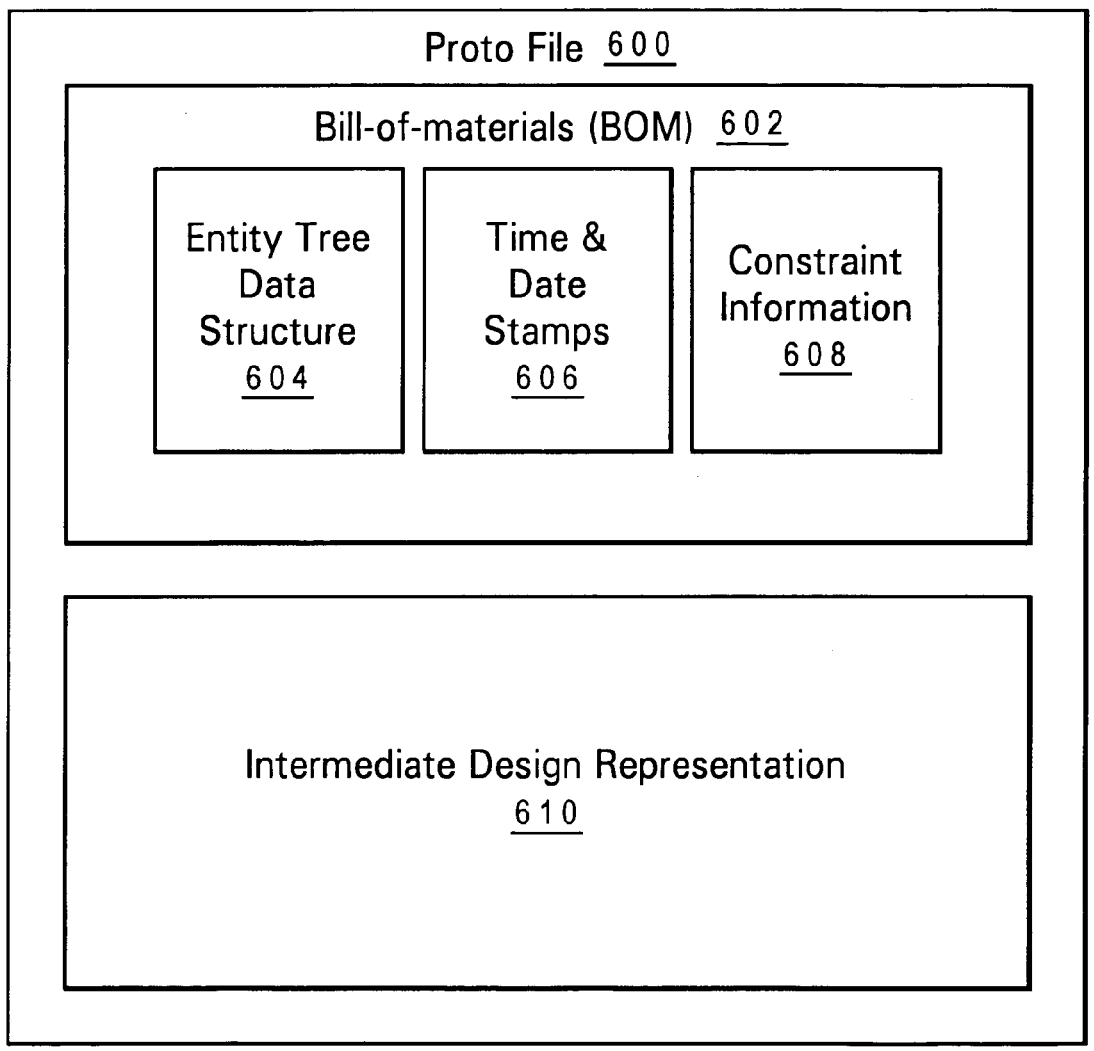
FIG. 6A illustrates an exemplary proto file containing a bill-of-materials (BOM) data structure indicating the hierarchical arrangement of design entities and instrumentation entities within the exemplary design hierarchy of FIG. 5.

With reference now to FIG. 6A, there is illustrated an exemplary proto file 600 in accordance with an exemplary embodiment of the present invention. Proto file 600, which is stored, for example, within disk/tape drive 33, may be either a design entity proto file 345 or an instrumentation entity proto file 460.

As shown, proto file 600 contains intermediate design representation 610, which represents compiled HDL source code describing a design or instrumentation entity, and a BOM 602. BOM 602 in turn contains an entity tree data structure 604, time and date stamps 606, and constraint information 608. Entity tree data structure 604 identifies the current entity, describes the descendant design entities, if any, instantiated by the current entity, the relationships between the descendant design entities, and all instrumentation entities, if any, associated with these design entities in the design hierarchy (whether or not the instrumentation entities are actually included in the simulation model). As described above, time and date stamps 606 indicate the time and date stamp of each source code files utilized to compile the entities included within entity tree data structure 604. Constraint information 608 represents in some fashion what constraints, if any, were placed on instrumentation entities when the proto file was originally compiled.

Referring now to FIG. 6B, there is depicted an exemplary entity tree data structure 604 for a particular proto file 600 in accordance with the present invention. In particular, the illustrated entity tree data structure 604 is that of the proto file of design entity A of design hierarchy 500 of FIG. 5.

Figure 6C:
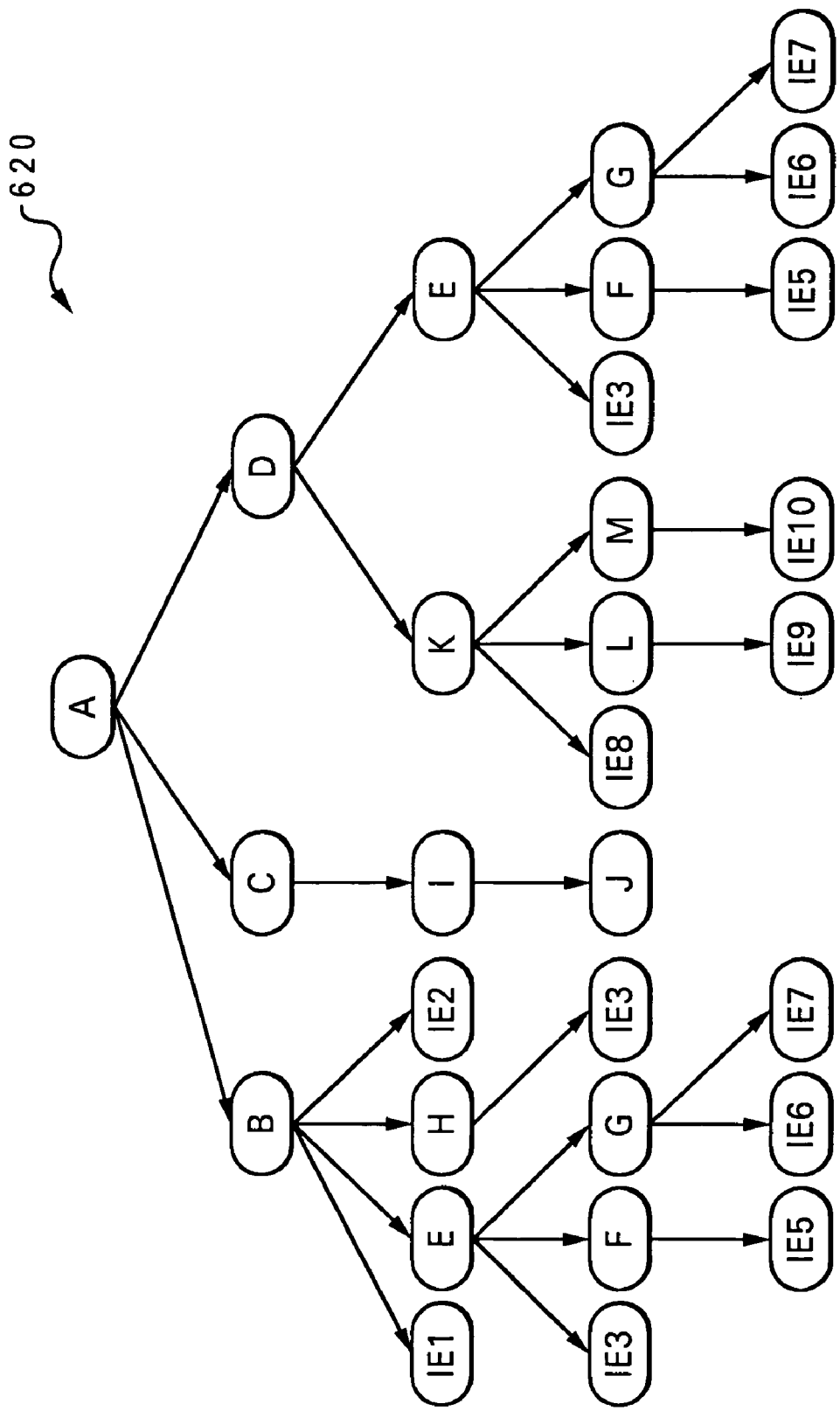
FIG. 6C is a diagrammatic representation of the contents of the entity tree data structure within the BOM of the proto file shown in FIG. 6A.

As indicated above, entity tree data structure 604 indicates the current entity (e.g., design entity A), each descendant entity instantiated directly or indirectly by the current entity (e.g., design entities B, C and D and the design entities in each of their respective sub-trees) and the hierarchical relationships therebetween, and the instrumentation entities associated with each such design entity. It should be noted that because constraint directives are invariant with respect to differing instances of a given design entity, entity tree data structure contains only one "branch" of the hierarchy for any given entity name at a given hierarchy level, even if that design entity is instantiated multiple times at the same level and scope of the design hierarchy. For example, as illustrated in FIG. 6B as well as in the diagrammatic representation 620 of entity tree data structure 604 given in FIG. 6C, design entity B is included within entity tree data structure 604 only once, even though design hierarchy 500 includes two instances, B1 and B2, of design entity B.

With reference now to FIG. 6D, there is illustrated an exemplary embodiment of constraint information 608 within the BOM 602 of proto file 600 of FIG. 6A. As above, the illustrated constraint information 608 is that of the proto file of top-level design entity A of design hierarchy 500 of FIG. 5.

Although in some embodiments constraint information 608 may simply list the constraint directives under which proto file 600 was compiled, in the exemplary embodiment constraint information 608 is implemented as a data structure that lists the current design entity (e.g., design entity A), all descendant entities in its sub-tree of design hierarchy 500, and those instrumentation entities that are actually present in the saved proto file based on the constraint directives, if any, applied when the proto file was built. For example, the illustrative constraint information 608 assumes the application of the constraint directive "{E}" with the polarity parameter INCLUDE, meaning that only the instrumentation entities associated with design entity E (i.e., IE3) and those associated with the design entities in the sub-tree of design entity E (i.e., IE5, IE6 and IE7) were compiled into proto file 600. Of course, the same illustrative constraint information 608 could alternatively be obtained by a number of other instrumentation control files 469, such as:

---
INCLUDE
<IE3>
{G}
[F]

---

Although only an exemplary BOM 602 for the proto file 600 of design entity A has been discussed in detail, it is important to note that the BOM 602 of every design entity preferably contains similar data structures. In other words, the BOM 602 of each other design entity will contain an entity tree data structure 604, time and date stamps 606, and constraint information 608 recording the particular subset of information within the BOM 602 of design entity A pertaining to the sub-tree of that design entity. For example, the entity tree data structure of design entity E of FIG. 5 may be given as follows:

| ENTITY | DESCENDANTS |
|--------|-------------|
| E | F, G, {IE3} |
| F | {IE5} |
| G | {IE6}, {IE7} |

It will be appreciated that since the exemplary constraint directive "{E}" includes all of the instrumentation entities instantiated within design entity E or any of its design entity descendants, the constraint information for design entity E will, like the entity tree data structure, specify all of instrumentation entities IE3, IE5, IE6 and IE7.

Referring now to FIG. 7, there is illustrated a high level logical flowchart of an exemplary check_bom() routine employed by HDL compiler 462 to verify that a proto file 345 stored within disk/tape drive 33 has consistent HDL source code files with those required for a current compilation and was compiled with the same set of instrumentation entities specified by the instrumentation control file 469, if any, of the current compilation. As illustrated, the process begins at block 700 and thereafter proceeds to block 702, which illustrates the check_bom() routine verifying that each proto file required to incrementally compile the current design entity exists and is consistent with the HDL source code files specified for inclusion within the current compilation. Thus, the check_bom() routine verifies that a proto file 345 or 460 exists for the current design entity, any descendant design entity of the current design entity, and any instrumentation entity of the current design entity or any descendant design entity. In addition, the check_bom() routine ensures that the time and date stamps 606 of each of these proto files (which indicates the time and date stamp of the corresponding HDL source files) matches the time and date stamps of the HDL source files needed to perform the current compilation. If all of these checks succeed, the process passes to block 706. If, however, any of the checks fails, the process passes to block 720, which depicts the check_bom() routine returning a FAIL result, thereby indicating that the current design entity must be compiled into the simulation executable model from the corresponding design entity HDL file 340.

If all of the preliminary checks depicted at block 702 succeed, then the check_bom() routine verifies that the instrumentation entities specified by the instrumentation control file 469, if any, match those compiled into the proto file of the current design entity utilizing the steps illustrated at blocks 706–722. Referring first to block 706, the check_bom() routine creates a temporary in-memory copy of the entity tree data structure 604 contained in the BOM 602 of the current design entity. This in-memory temporary entity tree data structure will be utilized to determine the set of instrumentation entities specified by instrumentation control file 469. If the polarity parameter within instrumentation control file 469 is INCLUDE, the temporary copy of the entity tree data structure is initialized without any instrumentation entities (which will subsequently be selectively added as the constraint directives in instrumentation control file 469 are processed). Conversely, if the polarity parameter within instrumentation control file 469 is EXCLUDE, the temporary copy of the entity tree data structure is initialized with all instrumentation entities (of which selective ones will be removed by subsequent processing of the constraint directives in instrumentation control file 469).

Next, the check_bom() routine determines at blocks 708 whether or not the inclusion or exclusion of instrumentation entities associated with the current design entity is subject to a design entity sub-tree directive of the form "{design_entity}", where the identified design entity is the current design entity or one of its ancestors. Because this condition may not be detectable directly from the constraint directive and the temporary copy of the entity tree data structure 604 (i.e., if the constraint directive identifies an ancestor of the current entity), check_bom() makes this determination by reference to a parent_flag that is set during the recursive processing of HDL compiler 462 and passed into the check_bom() routine, as described further below. In a preferred embodiment, parent_flag has three possible values, NULL, INCLUDE and EXCLUDE, where NULL indicates that parent_flag has not been set, INCLUDE indicates that all instrumentation entities that are descendants of the identified design entity should be included in the in-memory temporary copy of the entity tree data structure, and EXCLUDE indicates that all instrumentation entities that are descendants of the identified design entity should be excluded from the in-memory temporary copy of the entity tree data structure. As indicated at block 708, if parent_flag has a non-NULL value, the process passes to block 712.

Block 712 illustrates the check_bom() routine applying the design entity sub-tree directive to which the current design entity is subject to the temporary in-memory copy of the entity tree data structure in accordance with the polarity parameter specified in instrumentation control file 469. Because the application of this constraint directive includes or excludes a superset or identity set of the instrumentation entities specified by any other constraint directives within instrumentation control file 469, no other constraint directive within instrumentation control file 469 need be processed with respect to the temporary in-memory copy of the entity tree data structure. Following block 712, the process passes to block 718, which is described below.

Referring again to block 716, in the case that parent_flag is NULL, the check_bom() routine applies, to the temporary in-memory copy of the entity tree data structure and in accordance with the polarity parameter, each design-entity-specific and instrumentation-entity-specific constraint directive within instrumentation control file 469 that identifies the current design entity or any directly instantiated instrumentation entity. The process then passes from either block 712 or block 716 to block 718. At block 718, the check_bom routine determines whether or not the temporary in-memory entity tree data structure, which now represents the application of the constraint directives within instrumentation control file 469, identically matches the constraint information 608 in the BOM 602 of the proto file of the current design entity. If not, the check_bom() routine returns a FAIL result to indicate that the compilation should not utilize the proto file of the current design entity and terminates at block 720. However, if the check_bom() routine determines that the temporary in-memory entity tree data structure identically matches the constraint information 608 within instrumentation control file 469, the check_bom() routine returns a PASS result to indicate to HDL compiler 462 that the proto file of the current design entity may be utilized in the current incremental compilation.

By employing the check_bom() routine described above with reference to FIG. 7 and a few other modifications described below, HDL compiler 462 can support the selective incremental compilation of instrumentation entities within a simulation executable model. A pseudocode implementation of a main control loop of HDL compiler 462 supporting the selective incremental compilation of instrumentation entities into a simulation executable model is shown below (as above, line numbers are not a part of the pseudocode and are provided only for ease of reference):

```
Process_HDL_file3(file, design_flag, parent_flag)        5
{                                                        10
    If (parent_flag == NULL) {                           15
        My_parent = Check_parent(file);                  20
    } Else {                                             25
        My_parent = parent_flag;                         30
    }                                                    35
                                                         40
    If (NOT proto_loaded(file)) {                        45
        If (exists_proto_file(file) and                  50
        checkbom(file, my_parent)) {
            Load_proto(file);                            55
        } Else {                                         60
            Parse_HDL_file(file)                         65
            For (all instances in file) {                70
                Process_HDL_file3(instance,design_       80
                flag,my_parent));
            }                                            85
            If (design_flag == TRUE) {                   90
                For (all instrumentation instances in file) {   95
                    If (checkfile(instance, my_parent, file)) {  100
                        Process_HDL_file3(instance,      105
                        FALSE, null);
                    }                                    110
                }                                        115
            }                                            120
            Create_proto(file);                          125
            Write_proto_file(file);                      130
        }                                                135
    }                                                    140
    If (design_flag == TRUE) {                           145
        Create_instance(file);                           150
    }                                                    155
}                                                        160
```

As will be apparent upon comparison to the previous pseudocode algorithms, the process_HDL_file3() routine is an augmentation to process_HDL_file2() routine described above. Like process_HDL_file2(), process_HDL_file3() is a recursive routine that processe design hierarchy utilizing a depth-first traversal. At any given level of a particular sub-tree of the design hierarchy, process_HDL_file3() processes design entities first, and then processes instrumentation entities to be included in the simulation model, if any. Thus, for example, process_HDL_file3() may process the entities within design hierarchy 500 of FIG. 5 in the following partial ordering:

design entity F1
IE5
design entity G1
IE6 and IE7 (in any order)
design entity E1
IE3
. . .
design entity B2
design entity A Turning now to the pseudocode, the process_HDL_file 30 routine is invoked (line 5) with the name of the top-level design entity (e.g., design entity A) passed through the parameter "file," a "design_flag" parameter indicating whether the entity being processed is a design entity or an instrumentation entity (e.g., design_flag=TRUE for design entities and FALSE for instrumentation entities), and the "parent_flag" parameter described above initialized to NULL. Next, at lines 15–30, the temporary parameter my_parent is set to hold the correct value of parent_flag for the entity processed during the current recursive iteration of the routine.

In the case in which the parent_flag is NULL (line 15), meaning that the current entity being processed is not subject to a design entity sub-tree directive explicitly identifying an ancestor of the current entity, my_parent assumes the value returned by the helper routine check_parent() (line 20). The check_parent() routine examines instrumentation control file 469 to determine whether it contains a design entity sub-tree directive explicitly identifying the current entity. If so, the check_parent() routine returns the value of the polarity parameter specified in instrumentation control file 469. If, however, instrumentation control file 469 does not contain a design entity sub-tree directive explicitly identifying the current entity, the check_parent() routine returns a value of NULL.

Referring again to line 15, if parent_flag does not have a NULL value, the ELSE statement at line 25 directs that my_parent assume the value (e.g., INCLUDE or EXCLUDE) of the parent_flag to indicate the effect of a design entity sub-tree directive identifying an ancestor of the current entity (line 30).

Next, process_HDL_file3() determines at line 45 whether or not the proto for the current entity is already loaded in memory 44. If so, process_HDL_file3() proceeds directly to line 140, which is described below. If, however, the proto for the current entity is not loaded into memory 44, process_HDL_file3() proceeds to line 50. At line 50, process_HDL_file3() existence of a proto file for the current entity on tape/disk drive 33 and, if one exists, calls the check_bom() routine of FIG. 7 to verify that the proto file can be utilized in the compilation. It should be noted that my_parent is passed into check_bom() as the value of the formal parameter parent_flag, so that the check_bom routine can determine whether or not the current entity is subject to a design entity sub-tree directive within instrumentation control file 469. If check_bom() returns a PASS result, a recursive load_proto() routine is called (line 55) to load not only the specified proto for the current entity, but also the protos for any descendant entities.

If, however, check_bom() returns a FAIL result, the proto file on tape/disk drive 33 cannot be utilized to compile the current entity. Accordingly, process_HDL_file3() parses the HDL file for the current entity with a call to parse_HDL_file (file) (line 65). In addition, process_HDL_file3() recursively call itself for all design entity instances instantiated by the HDL file for the current design entity (line 80).

Next, process_HDL_file3() determines whether the current entity being processed is a design entity by checking whether "design_flag=TRUE" (line 90). If so, any instrumentation entities that might occur in the design entity are processed (lines 95–105) in a loop that recursively calls process_HDL_file3() for each instrumentation entity. Inside this recursive loop, the helper routine check_file() is called to apply the constraint directive(s) in instrumentation control file 469 to include or exclude a current instrumentation entity from the compilation (line 100). The routine check_file() returns TRUE if the instrumentation entity denoted by the "inst" parameter should be included in the compilation, and FALSE otherwise.

Figure 8:
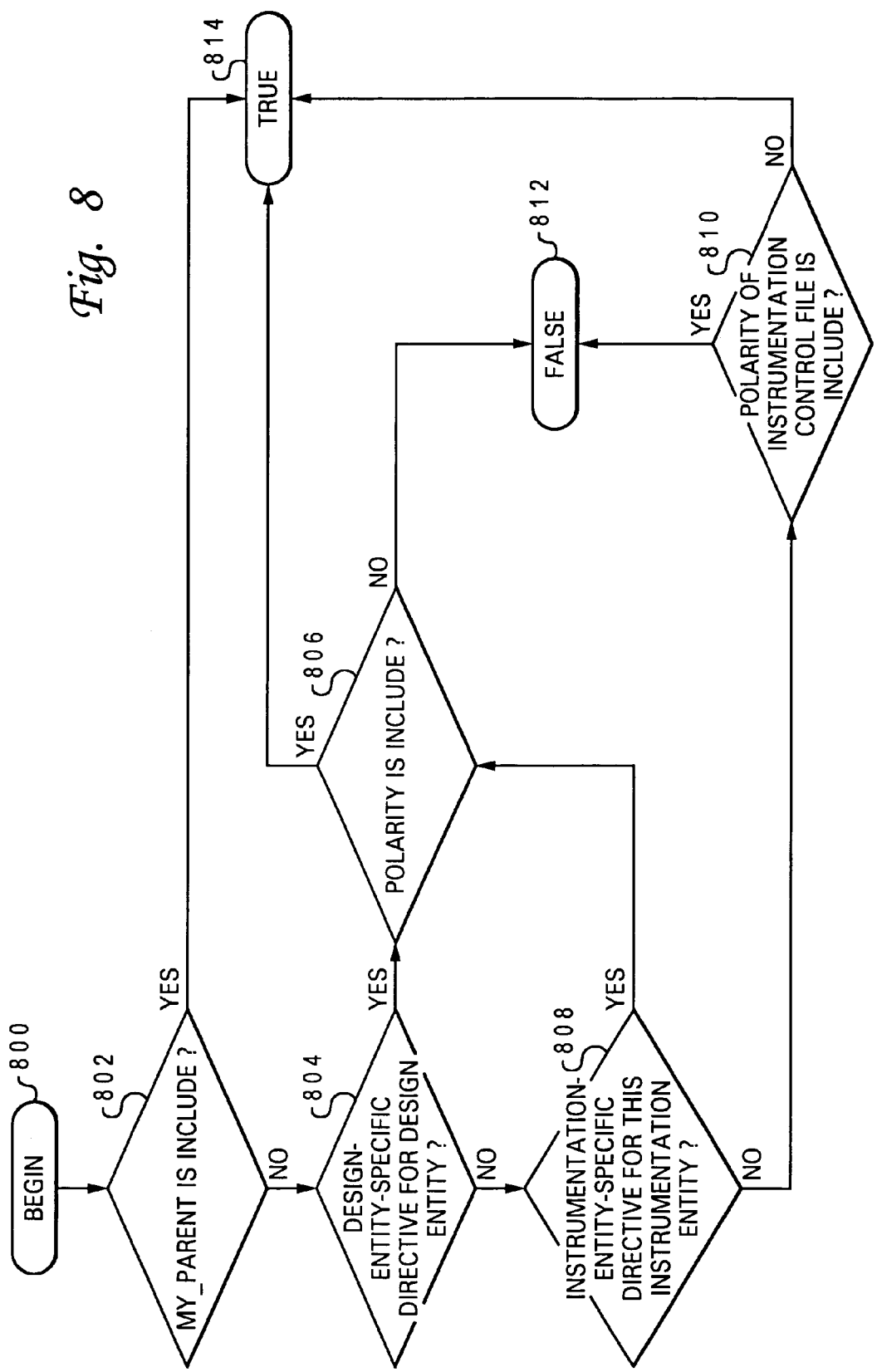
FIG. 8 is a high level logical flowchart of an illustrative check_file() routine, which is called by an HDL compiler to apply user-selected constraints regarding the inclusion of instrumentation entities within an incremental compilation of a simulation model.

Referring now to FIG. 8, there is depicted a high level logical flowchart of an exemplary embodiment of the check_file() routine. As illustrated, the process begins at block 800 and then proceeds to block 802, which depicts an evaluation of the state of the my_parent parameter. If my_parent is set to INCLUDE, meaning that the instrumentation entity is subject to a design entity sub-tree directive and will therefore be included in the compilation, the routine returns TRUE and exits at block 814.

If my_parent is not set to INCLUDE, the check_file() routine examines instrumentation control file 469 at block 804 for an design-entity-specific directive identifying the design entity identified by the "file" parameter passed to the check_file() routine. If instrumentation control file 469 contains such a constraint directive, the check_file() routine returns a TRUE result and exits at block 814 if the polarity parameter of instrumentation control file 469 is INCLUDE (block 806), and returns FALSE and exits at block 812 in response to a determination at block 806 that the polarity parameter is not INCLUDE (i.e., EXCLUDE).

In response to a determination at block 804 that the instrumentation entity is not specified by a design-entity-specific directive, a further determination is made at block 808 whether or not the instrumentation entity identified by the "instance" parameter of check_file() is specified by an instrumentation-entity-specific directive within instrumentation control file 469. If instrumentation control file 469 contains such a constraint directive, the check_file() routine returns a TRUE result and exits at block 814 if the polarity parameter of instrumentation control file 469 is INCLUDE (block 806), and returns FALSE and exits at block 812 in response to a determination at block 806 that the polarity parameter is not INCLUDE (i.e., EXCLUDE).

Finally, if neither of the tests illustrated at blocks 804 and 808 has an affirmative result, the check_file() routine includes or excludes the instrumentation entity based upon the polarity parameter specified within instrumentation control file 469. That is, if a determination is made at block 810 that the polarity parameter has the value EXCLUDE, meaning that instrumentation entities are included in the compilation by default, check_file() returns TRUE and exits at block 814. If, however, the polarity parameter is INCLUDE, check_file() returns FALSE and exits at block 812.

Returning to line 100 of the pseudocode of process_HDL_file3(), the basic purpose of the check_file() routine is to determine whether or not a particular instrumentation entity should be included in the compilation. If a FALSE result is returned, meaning that instrumentation control file 469 prevents the particular instrumentation entity from being included, process_HDL_file3() is simply not called recursively at line 105. In this manner, the instrumentation entities that should not be included in the simulation executable model are ignored.

Following the processing represented by lines 90–105, the process_HDL_file3() routine proceeds to call the routines create_proto and write_proto_file (lines 125 and 130), which function as described above, except that these routines also create the additional data structures 604, 608 within BOM 602, as described above with reference to FIG. 6. Once the proto is present in memory 44 either because the proto was already loaded (line 45) or was created as described above, process_HDL_file3() calls a recursive create_instance() routine (line 150) to create the instance data structures for the current design entity and any descendant design entities. (Instrumentation load tool 464 creates instance data structures for instrumentation entities in subsequent processing.)

As has been described, the present invention provides a data processing system, method and computer program product that permit a user to selectively include instrumentation entities within an incrementally compiled simulation executable model of a digital design.

While the invention has been particularly shown as described with reference to a preferred embodiment, it will be understood by those skilled in the art that various changes in form and detail may be made therein without departing from the spirit and scope of the invention. For example, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method of compiling a simulation model of a digital design, said method comprising:

receiving as an input into a model build process constraint information indicating a desired set of instrumentation entities to be included within a simulation model of a digital design described by a plurality of hierarchically arranged design entities, wherein said instrumentation entities monitor logical operation of one or more of said plurality of design entities during simulation for occurrence of events of interest, wherein the desired set of instrumentation entities includes fewer than all instrumentation entities defined for the simulation model, and wherein said constraint information is distinct from source code files describing said plurality of design entities and said instrumentation entities defined for the simulation model;

in response to receiving said constraint information determining by reference to a bill-of-materials of a previously compiled file whether or not the previously compiled file was compiled with instrumentation entities compatible with the desired set of instrumentation entities such that no instrumentation entity excluded by the desired set is included in the previously compiled file and that no instrumentation entity indicated by the desired set as being included in the simulation model is excluded from the simulation model by the previously compiled file; and in response to determining that the previously compiled file was compiled with compatible instrumentation entities, compiling the simulation model of the digital design utilizing said previously compiled file in accordance with the constraint information.

2. The method of claim 1, wherein each of said plurality of design entities is defined by one or more hardware definition language (HDL) files, and wherein each of the instrumentation entities is associated with one or more of the plurality of design entities by a statement within the one or more HDL files defining the one or more associated design entities.

3. The method of claim 1, wherein said determining includes examining a constraint information data structure within the bill-of-materials.

4. The method of claim 1, wherein the previously compiled file is a first previously compiled file, and further comprising performing said determining in response to a determination that a second previously compiled file corresponding to a parent design entity of a current entity corresponding to the first previously compiled file was not compiled with instrumentation entities compatible with the desired set.

5. The method of claim 1, and further comprising:
in response to a determining that said previously compiled file was not compiled with a compatible set of instrumentation entities, compiling a portion of the simulation model corresponding to previously compiled file from one or more source code files.

6. The method of claim 1, and further comprising performing said determining and said compiling for said plurality of hierarchically arranged design entities in a recursive process.

7. A data processing system for compiling a simulation model of a digital design, comprising:
processing resources;
data storage coupled to the processing resources, said data storage including a compiler for compiling a simulation model of a digital design, wherein said compiler includes:
means for receiving as an input into a model build process constraint information indicating a desired set of instrumentation entities to be included within a simulation model of a digital design described by a plurality of hierarchically arranged design entities, wherein said instrumentation entities monitor logical operation of one or more of said plurality of design entities during simulation for occurrence of events of interest, wherein the desired set of instrumentation entities includes fewer than all instrumentation entities defined for the simulation model, and wherein said constraint information is distinct from source code files describing said plurality of design entities and said instrumentation entities defined for the simulation model;
means, responsive to receiving said constraint information, for determining by reference to a bill-of-materials of a previously compiled file whether or not the previously compiled file was compiled with instrumentation entities compatible with the desired set of instrumentation entities such that no instrumentation entity excluded by the desired set is included in the previously compiled file and that no instrumentation entity indicated by the desired set as being included in the simulation model is excluded from the simulation model by the previously compiled file; and
means, responsive to determining that the previously compiled file was compiled with compatible instrumentation entities, for compiling the simulation model of the digital design utilizing said previously compiled file in accordance with the constraint information.

8. The data processing system of claim 7, wherein each of said plurality of design entities is defined by one or more hardware definition language (HDL) files, and wherein each of the instrumentation entities is associated with one or more of the plurality of design entities by a statement within the one or more HDL files defining the one or more associated design entities.

9. The data processing system of claim 7, wherein said means for determining includes means for examining a constraint information data structure within the bill-of-materials.

10. The data processing system of claim 7, wherein the previously compiled file is a first previously compiled file, and wherein said means for determining comprises means for determining whether or not the first previously compiled file was compiled with instrumentation entities compatible with the desired set of instrumentation entities in response to a determination that a second previously compiled file corresponding to a parent design entity of a current entity corresponding to the first previously compiled file was not compiled with instrumentation entities compatible with the desired set.

11. The data processing system of claim 7, and further comprising:
means, responsive to determining that said previously compiled file was not compiled with a compatible set of instrumentation entities, for compiling a portion of the simulation model corresponding to previously compiled file from one or more source code files.

12. The data processing system of claim 7, wherein said means for determining comprises means for determining utilizing a recursive process that traverses a logical tree formed by said plurality of hierarchically arranged design entities.

13. A program product for compiling a simulation model of a digital design, comprising:
a computer readable storage medium;
a compiler within the computer readable storage medium for compiling a simulation model of a digital design, wherein said compiler includes:
means for receiving as an input into a model build process constraint information indicating a desired set of instrumentation entities to be included within a simulation model of a digital design described by a plurality of hierarchically arranged design entities, wherein said instrumentation entities monitor logical operation of one or more of said plurality of design entities during simulation for occurrence of events of interest, wherein the desired set of instrumentation entities includes fewer than all instrumentation entities defined for the simulation model, and wherein said constraint information is distinct from source code files describing said plurality of design entities and said instrumentation entities defined for the simulation model;
means, responsive to receiving said constraint information, for determining by reference to a bill-of-materials of a previously compiled file whether or not the previously compiled file was compiled with instrumentation entities compatible with the desired set of instrumentation entities such that no instrumentation entity excluded by the desired set is included in the previously compiled file and that no instrumentation entity indicated by the desired set as being included in the simulation model is excluded from the simulation model by the previously compiled file; and
means, responsive to determining that the previously compiled file was compiled with compatible instrumentation entities, for compiling the simulation model of the digital design utilizing said previously compiled file in accordance with the constraint information.

14. The program product of claim 13, wherein each of said plurality of design entities is defined by one or more hardware definition language (HI)L) files, and wherein each of the instrumentation entities is associated with one or more of the plurality of design entities by a statement within the one or more HDL files defining the one or more associated design entities.

15. The program product of claim 13, wherein said means for determining includes means for examining a constraint information data structure within the bill-of-materials.

16. The program product of claim 13, wherein the previously compiled file is a first previously compiled file, and wherein said means for determining comprises means for determining whether or not the first previously compiled file was compiled with instrumentation entities compatible with the desired set of instrumentation entities in response to a determination that a second previously compiled file corresponding to a parent design entity of a current entity corresponding to the first previously compiled file was not compiled with instrumentation entities compatible with the desired set.

17. The program product of claim 13, and further comprising:

means, responsive to determining that said previously compiled file was not compiled with a compatible set of instrumentation entities, for compiling a portion of the simulation model corresponding to previously compiled file from one or more source code files.

18. The program product of claim 13, wherein said means for determining comprises means for determining utilizing a recursive process that traverses a logical tree formed by said plurality of hierarchically arranged design entities.

* * * * *